United States Patent [19]

Krajewski et al.

[11] Patent Number: 5,167,511

[45] Date of Patent: Dec. 1, 1992

[54] HIGH DENSITY INTERCONNECT APPARATUS

[75] Inventors: Nicholas J. Krajewski, Chippewa Falls, Wis.; Carl D. Breske, Scandia, Minn.; David J. Johnson; David R. Kiefer, both of Chippewa Falls, Wis.; Kent T. McDaniel, Eau Claire, Wis.; William T. Moore, Jr., Elk Mound, Wis.; Michael R. Edwards, Eau Claire, Wis.; Bricky A. Stephenson, Chippewa Falls, Wis.; Anthony A. Vacca, Eau Claire, Wis.

[73] Assignee: Cray Research, Inc., Eagan, Minn.

[21] Appl. No.: 618,603

[22] Filed: Nov. 27, 1990

[51] Int. Cl.$^5$ .................... H01R 23/70; H05K 1/11
[52] U.S. Cl. .................... 439/61; 439/67; 439/161; 439/260; 361/413
[58] Field of Search .................... 439/65, 59–62, 439/67, 77, 493, 161, 260; 361/413, 415

[56] References Cited

U.S. PATENT DOCUMENTS

| | | | |
|---|---|---|---|
| 2,701,346 | 2/1955 | Powell | 439/75 |
| 3,139,559 | 6/1964 | Heidler | |
| 3,187,210 | 6/1965 | Ost | |
| 3,212,049 | 10/1965 | Mittler et al. | |
| 3,526,869 | 9/1970 | Conrad et al. | 439/260 |
| 3,529,213 | 9/1970 | Farrand et al. | |
| 3,541,490 | 11/1970 | Berg | |
| 3,541,494 | 11/1970 | Berg | |
| 3,913,444 | 10/1975 | Otte | 29/447 |
| 4,054,939 | 10/1977 | Ammon | 361/414 |
| 4,220,382 | 9/1980 | Ritchie et al. | |
| 4,272,143 | 6/1981 | Weiss | |
| 4,400,049 | 8/1983 | Schuck | |
| 4,462,651 | 7/1984 | McGaffigar | 439/161 |
| 4,472,765 | 9/1984 | Hughes | 361/393 |
| 4,621,882 | 11/1986 | Krumme | 439/161 |
| 4,626,056 | 12/1986 | Andrews, Jr. et al. | |
| 4,629,270 | 12/1986 | Andrews, Jr. et al. | 439/260 |
| 4,744,764 | 5/1988 | Rubenstein | 439/260 |
| 4,838,798 | 6/1989 | Evans et al. | 439/493 |
| 4,881,908 | 11/1989 | Perry et al. | 439/161 |

FOREIGN PATENT DOCUMENTS 54-53288 4/1979 Japan .................... 439/161

OTHER PUBLICATIONS

Document, "Shape Memory Metal" published by Raychem (no date).
Document, "CryoTact Dip Socket" published by Raychem (no date).
Article "Titanium: for When you care enough to use the Very Best", Smithsonian Magazine, May 1987, vol. 18 No. 2.
The article "55-Nitinol: Unique Wire Alloy with a Memory", Wire Journal, p. 41, Jun. 1969.
The article "The Shape Memory Effect in Alloys", Metal Science Journal, p. 175, 1972.
The article "Shape Memory Effect Alloys: Basic Principles" (no date).
Document "PGA Connector", published by Raychem (no date).

Primary Examiner—Neil Abrams
Attorney, Agent, or Firm—Merchant, Gould, Smith, Edell, Welter & Schmidt

[57] ABSTRACT

The invention comprises a plurality of stacked planar processing circuit boards surrounded on at least one side by a plurality of memory boards located substantially perpendicular to the planar processing boards, the processing and memory boards connected by orthogonal interconnect modules. The orthogonal interconnect modules allow closely-spaced orthogonal connection of the processing boards to the memory boards. The memory boards are of a densely packed design having a plurality of removeable memory chip stacks located on the memory boards.

26 Claims, 20 Drawing Sheets

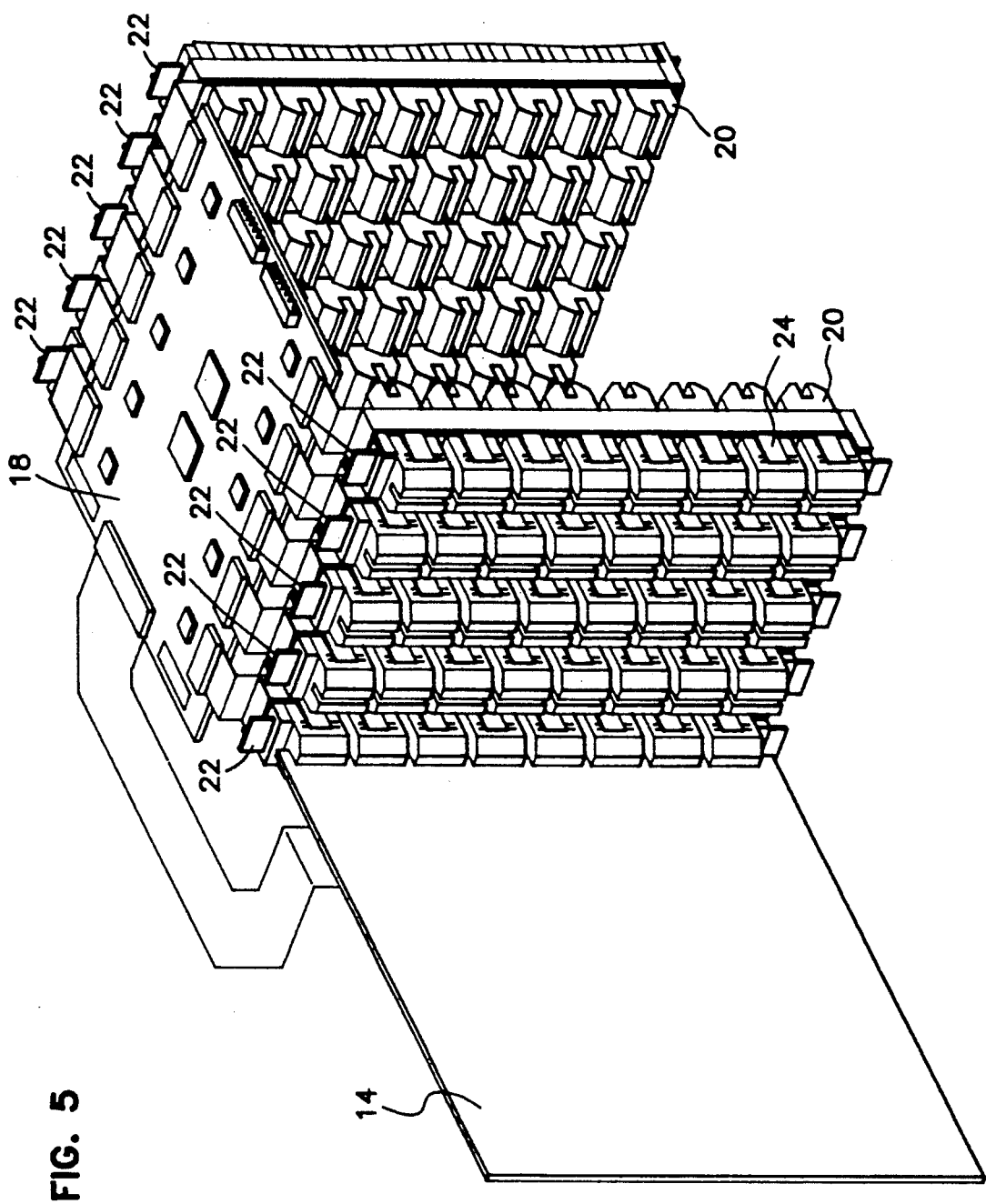

5,167,511

HIGH DENSITY INTERCONNECT APPARATUS

TECHNICAL FIELD OF THE INVENTION

The present invention relates to a high density interconnect apparatus for connecting a plurality of central processing boards with a plurality of memory boards in a close configuration. More particularly, the invention comprises a plurality of stacked central processing boards surrounded on two sides by a plurality of memory boards located in planes perpendicular to the central processing board planes and connected by orthogonal interconnect modules.

BACKGROUND OF THE INVENTION

Large electrical devices such as supercomputers of the type manufactured by Cray Research, Inc., the assignee of the present invention, are constructed of a large plurality of integrated circuit chips for both processing and memory. In order to increase the processing speed of these electrical devices, the processors are being connected closer to one another to increase the speed of the units.

In the prior art, the connections between the central processing boards and memory boards of multiprocessor systems have been both cumbersome and long. As a result, the processing speed of the systems has been limited by the speed with which electronic signals can physically travel along connections, which is approximately one nanosecond per foot of length traveled. In addition, such systems have been difficult to disassemble for repair.

Further adding to the physical length of connections between the processing units and memory is the concept of a "completely connected system" as required in multiprocessor computer systems. Completely connected systems require that each central processing board be connected with each memory board, resulting in a large number of connections and increased distances between the central processing boards and memory boards. As a result, the delays caused by signals travelling between the boards have limited the speed of multiprocessor supercomputer systems of the type manufactured by Cray Research, Inc.

In order to overcome the problems of the prior art, the present invention employs a novel system of orthogonal connectors to provide a large number of short connections between circuit boards. The connectors employ shape memory metals which are disclosed for use in electronic connectors in U.S. Pat. No. 4,621,882 to Krumme, issued on Nov. 11, 1989, which is incorporated herein by reference. That reference discloses semi-circular connectors using shape memory metal primarily to provide zero-insertion-force connectors and include traces on flexible circuits to make connection to traces on boards. That reference does not, however, refer to the use of such connectors in orthogonal connectors, nor does it refer to the use of such connectors in close configured completely connected multiprocessor systems as described herein.

SUMMARY OF THE INVENTION

The present invention relates primarily to the organization and physical connection between a number of central processing (CP) boards with a number of common memory module (CMM) boards in a completely connected multiprocessor computer system. More particularly, the present invention describes a plurality of stacked CP boards connected on opposing edges to CMM boards which are located in planes perpendicular to those of the CP boards. That orthogonal relationship between the CP boards and the CMM boards allows for a physically small package even though the system is completely connected by a sufficient number of interconnections to allow each CP board to adequately access the memory contained in each CMM board.

To accomplish the orthogonal connections between boards, the present invention further comprises an orthogonal interconnect module (OIM) which is particularly well suited to connecting boards located in perpendicular planes with a large number of interconnections having a short length. The distance between the boards is critical to insure that the time needed for signal travel does not inordinately limit the processing speed of the system.

In addition, the orthogonal interconnect modules also include memory metal connection devices which allow zero insertion force (ZIF) connections between the OIM and boards. Such zero insertion force connectors are advantageous in that boards may be removed as required for repairs or servicing without damaging them. In the preferred embodiment, the orthogonal interconnect modules with their memory metal connections can be controlled by heaters to allow the connections to open for removal or insertion of a board, but when cooled, provide an adequate force to make electrical connection between the board and connector.

In the preferred embodiment, the orthogonal interconnect modules further include two flex cables which together supply 520 separate traces terminating in contact bumps to connect the boards at each end of the OIM. The maximum trace length of the preferred flex cable is less than four inches, thus providing a closely spaced short path interconnect between the CP boards and the CMM boards of the preferred embodiment. In addition, individual cables can be replaced if damaged or otherwise inoperative.

The resulting preferred package of stacked CP boards surrounded on two sides by CMM boards stacked in perpendicular planes is submerged in a thermally conductive, electrically insulated bath to provide sufficient cooling of the boards during operation. In the preferred embodiment, the electrical power supplies for the system are located directly below the boards, resulting in a compact, high speed multiprocessor based supercomputer.

Also in the preferred embodiment, each CMM board includes a plurality of memory chip stacks with each pair of stacks supported by a pair of common memory stack edge boards which, in turn, plug into memory stack connectors (MSC). Each preferred MSC includes a memory metal portion which allows the connector to open and close as desired to provide a zero insertion force (ZIF) connection between the edge boards and the CMM board, thus allowing for simplified off-board repair of the memory stacks.

Each MSC preferably includes a flex connector attached to the MSC having a plurality of trace lines that connects the edge boards to the CMM board to provide electrical communication lines between the stacked memory chips and the CMM board. The edge boards have a plurality of traces connected to the memory chips matching the pattern of those on the MSC flex connector. The edge boards also contain through-holes to connect with leads protruding from the memory chips. The chip leads are preferably bent to provide mechanical and thermal stability to the stacks.

In the preferred embodiment, the CP and CMM boards consist of multi-layer circuit boards whose construction is well-known to those skilled in the art. The preferred embodiment of the CP boards includes 10 locations (five on each of two opposing major sides) for interconnection with the orthogonal interconnect modules which are, in turn, each connected to a CMM board or other electrical component. Also in the preferred embodiment, the CP boards contain areas on the two edges not connected to CMM's for connection of power to the CP board and the logic chip packages contained thereon. The preferred CMM boards include sixteen locations (eight on each major side) for interconnection with the orthogonal interconnect modules, which are connected to the CP boards.

BRIEF DESCRIPTION OF THE DRAWINGS

FIG. 5 is a perspective view of the array of orthogonal interconnect modules shown as connected to one of the CMM boards units;

DETAILED DESCRIPTION OF THE PREFERRED EMBODIMENT

Figure 1:
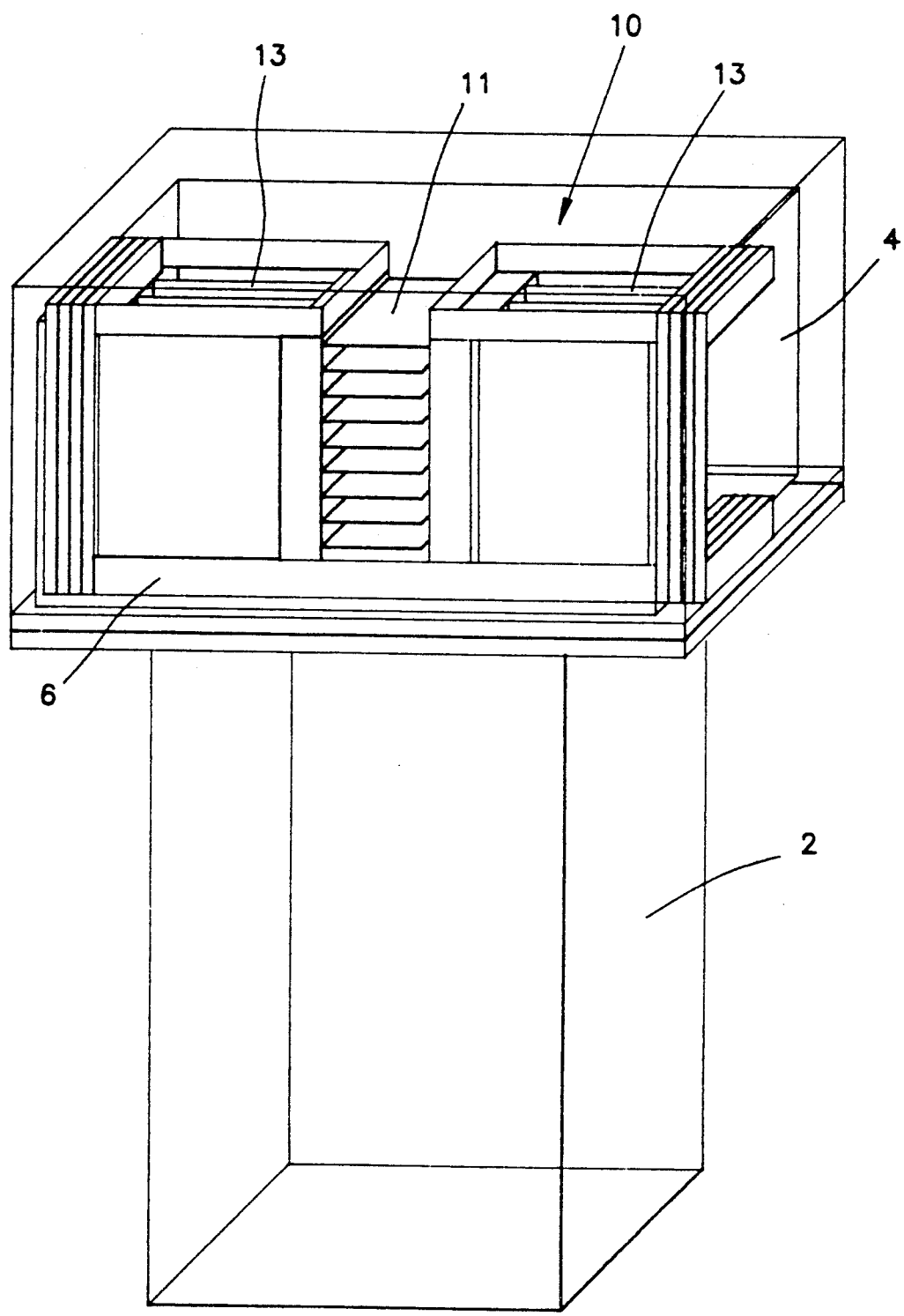
FIG. 1 is a perspective view of a CP board stack, surrounding CMM boards and power supply cabinet.
Figure 2:
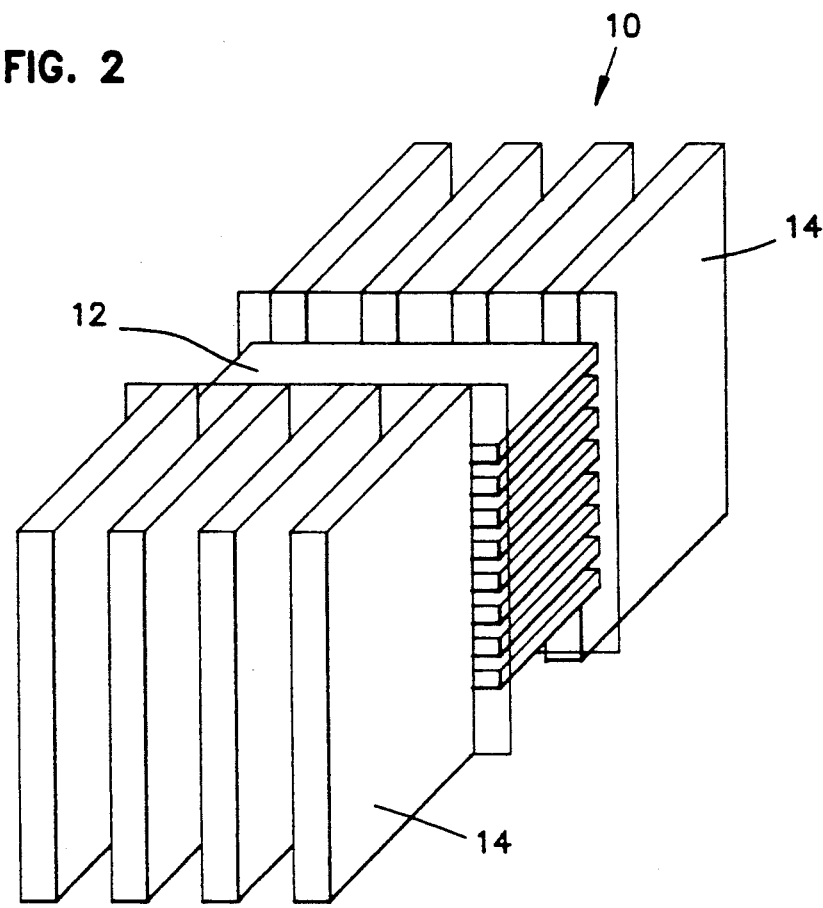
FIG. 2 is a perspective view of the stacked CP boards surrounded on two sides by orthogonally connected CMM boards.

The preferred embodiment of the present invention relates to the high density packaging of processors and memory in a multiprocessor system in which a plurality of CP circuit boards are connected to a plurality of CMM circuit boards using orthogonal interconnect modules (OIM) to form a completely connected system in which each CP board is connected all CMM boards. The application of this technology is designed for speed improvements, improved heat dissipation, improved packaging density and shortened distances between the CP boards and the full array of CMM boards required for modern multiprocessing supercomputers of the type manufactured by Cray Research, Inc., assignee of the present invention.

By stacking the CP boards in a closely spaced relationship and arraying CMM boards along two sides of the CP board stack in planes perpendicular to the planes occupied by the CP boards, each CP board can be connected to each CMM board, thereby allowing each CP board access to all CMM boards as required to speed the processing of the system. Previous attempts to completely connect such systems has met with limited success as either the number of connections between the CP and CMM boards has been limited or the connection lengths have been prohibitively long, thereby slowing the computing speed of the unit.

By using the board stacking arrangements, orthogonal interconnect modules (OIM), and densely packed memory boards disclosed in this application, the problems associated with completely connected systems have been avoided. A more detailed description of the entire system follows below.

SYSTEM PACKAGING

As shown in FIGS. 1-4, the CP board stack 11 is surrounded on two sides by CMM board stacks 13 which are aligned in planes perpendicular to the planes of the CP board stack 11. In the preferred embodiment, the CP board stack 11 contains eight CP boards 12 and each CMM board stack 13 contains four memory boards 14 and space for one additional board 16 (see FIG. 3) which can supply a number of required functions such as interprocessor communications, Input-/Output (I/0) translators, clock distribution and other required system components.

The CP and CMM board stacks 11,13 are preferably immersed in a cooling fluid (not shown) such as FLUORINERT ® or a comparable cooling fluid for electrical components. The fluid is preferably circulated such that it comes up through the area below the boards into a manifold 6 which directs it through the CP board stack 11 from the rear to the front and also in an upward direction through the CMM board stacks 13. The fluid used to cool the boards then flows out the top of the inner wall 7 of the board stack container 4 and is returned down between the inner 7 and outer walls 8 of the board stack container 4 and to the base 2 where it cools the power supplies (not shown) for the system. Once through the power supplies, the fluid is returned to a reservoir and associated chiller (not shown). An example of such a cooling system is described in U.S. Pat. No. 4,590,538 to Cray, Jr. issued May 20, 1986, titled "Immersion Cooled High Density Electronic Assembly", assigned to the assignee of the present invention and which is hereby incorporated by reference.

ORTHOGONAL INTERCONNECT MODULE ARRAY

An overall system view of the preferred embodiment of the orthogonal interconnect module (OIM) array is shown in FIG. 5 where each of the eight CMM boards 14 (four per side) are connected to each of the eight stacked CP boards 12 by an OIM 20.

Each column of OIM's 20 is located on a T-shaped channel 22 which is used to precisely locate each OIM 20 and prevent it from moving in the system. In the preferred embodiment, the OIM's 20 are located on centers approximately 1.2" apart along the T-shaped channel 22.

Figure 6:
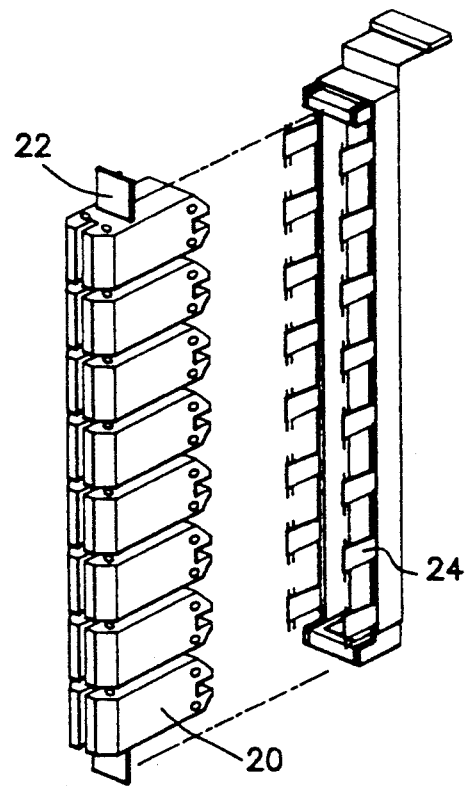
FIG. 6 is an assembly view of one column of orthogonal interconnect modules and associated T-beam and heater power supply structure.
Figure 3:
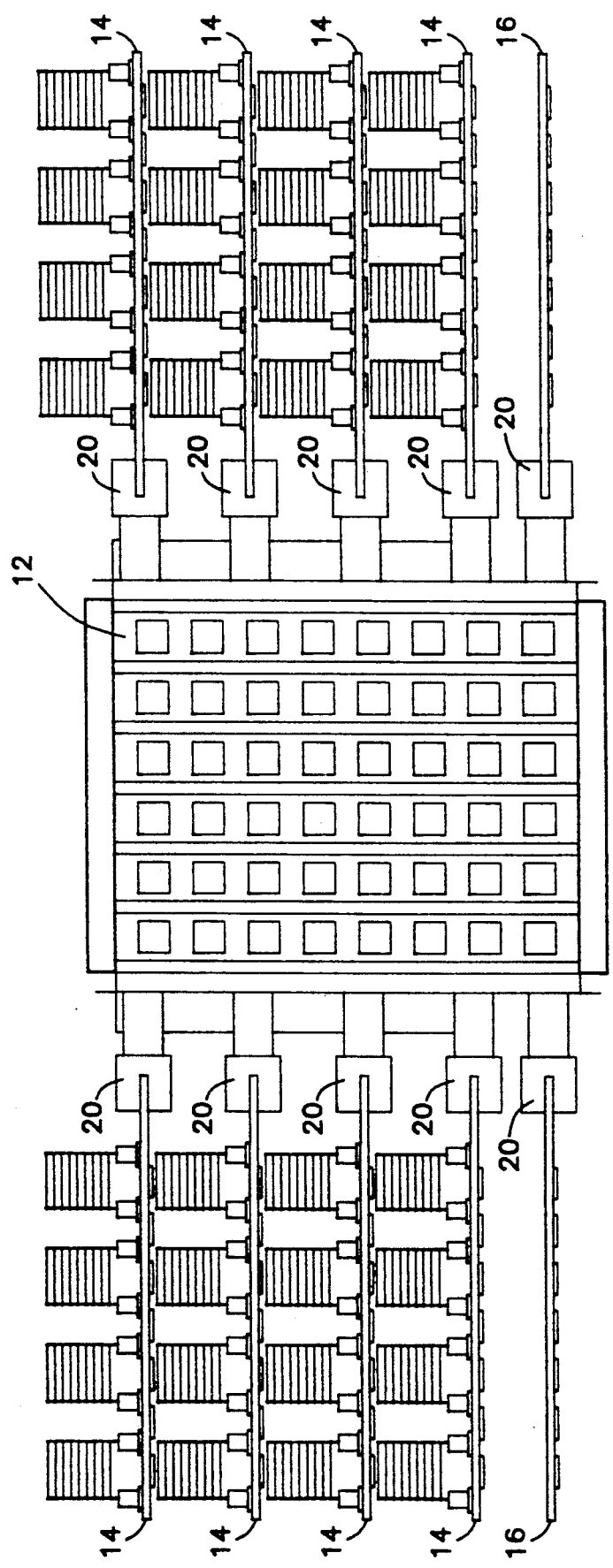
FIG. 3 is a top view of the CP board stack surrounded on two sides by the orthogonally connected CMM boards.
Figure 4:
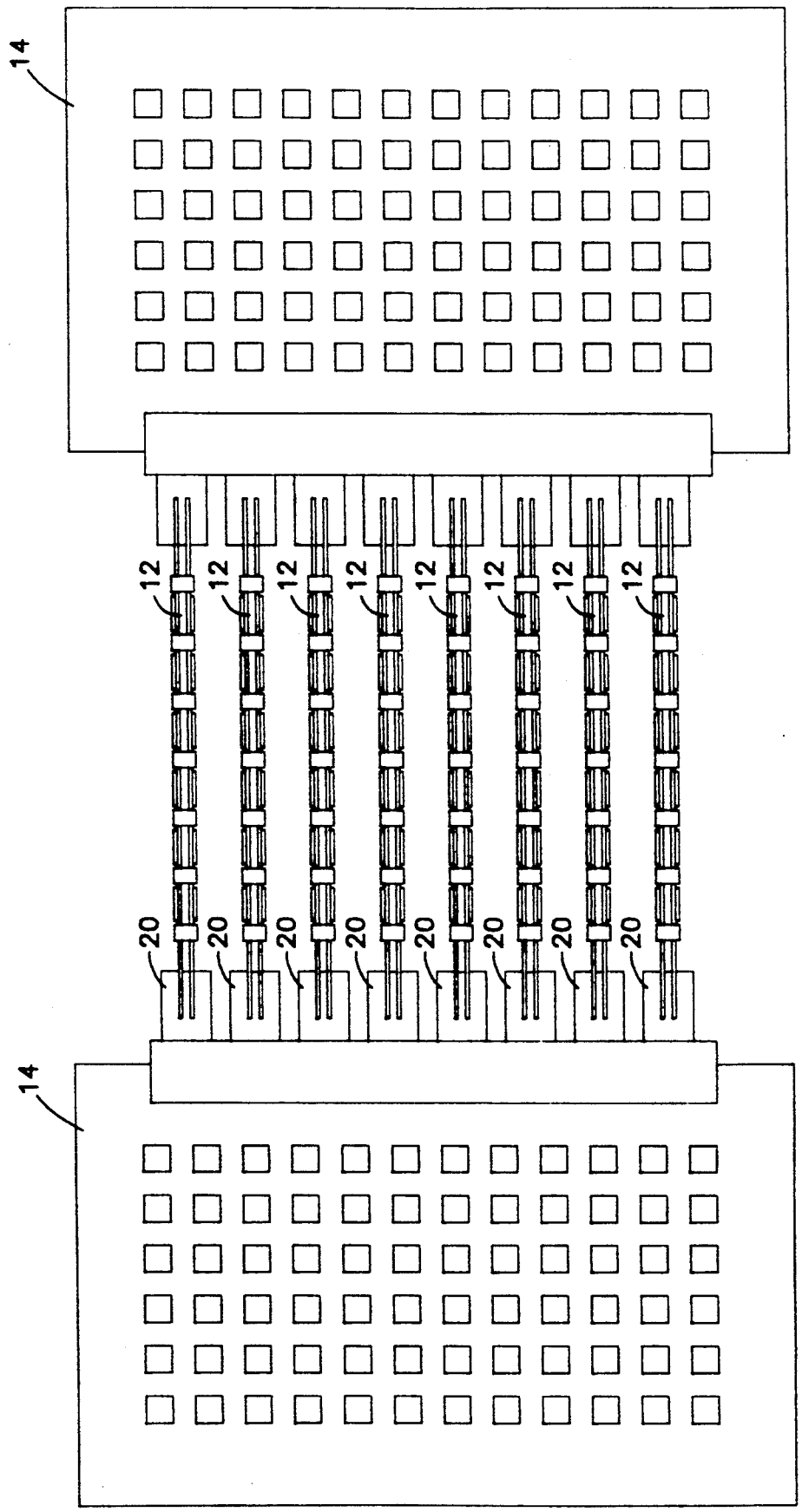
FIG. 4 is a side view of the CP board stack and orthogonally connected CMM boards.

In addition to the T-shaped channel 22, each OIM column is also attached to an electronic heater connection strip 24 as shown in FIG. 6. This strip 24 connects each orthogonal interconnect module's heaters 46 (see FIG. 6) to power supplies (not shown) to allow the OIM's 20 to be opened as required. As will be understood by referring to the array of FIG. 5, groups of OIM's 20 can be opened in either vertical columns to remove a CMM board 14 or in horizontal rows to remove a CP board 12. Power is distributed to the heating elements 46 of the OIM's 20 by a power board 18 located on top of the CP board stack 11.

ORTHOGONAL INTERCONNECT MODULE

Figure 7:
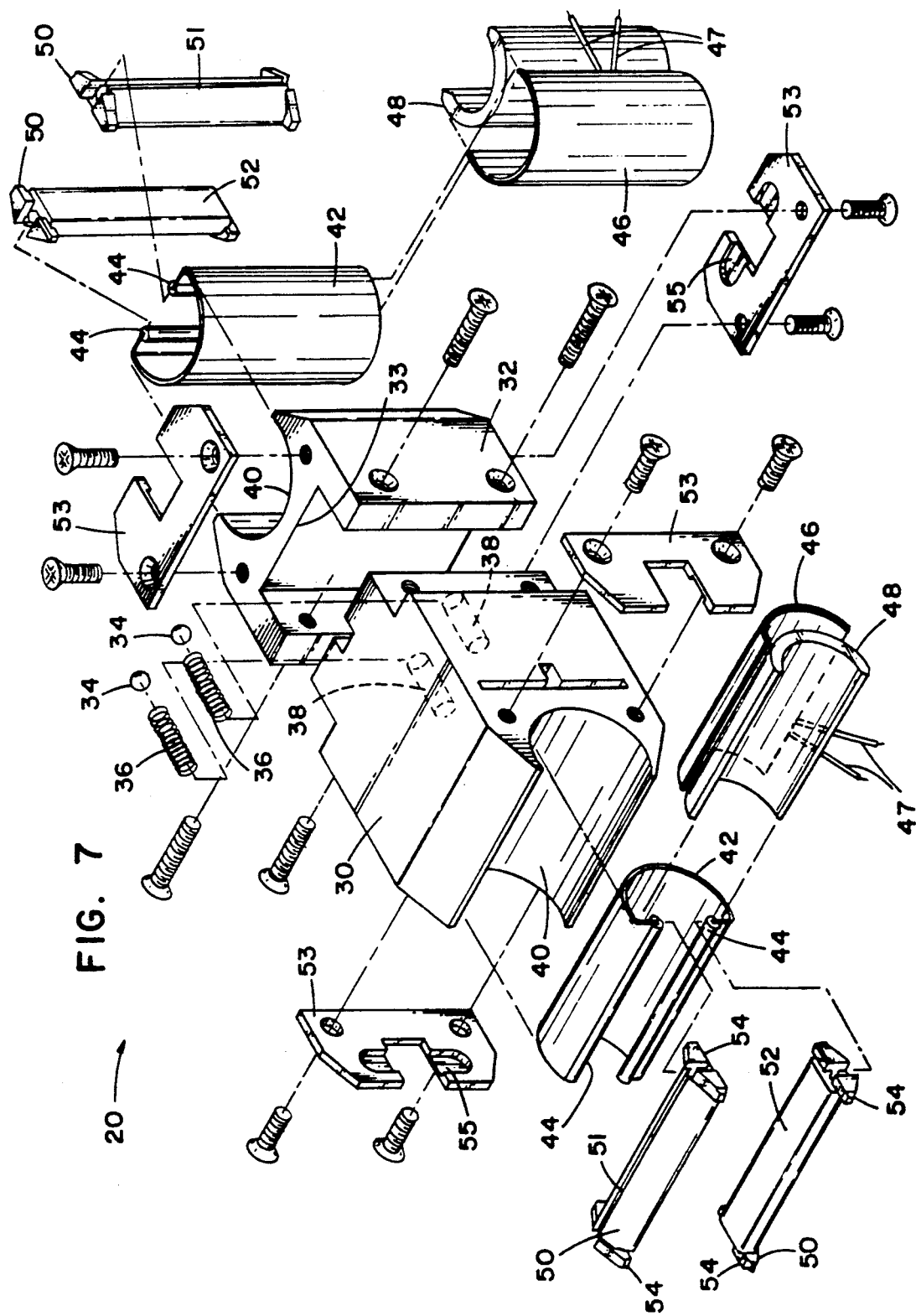
FIG. 7 is an exploded assembly view of an orthogonal interconnect module without flex cables.
Figure 8:
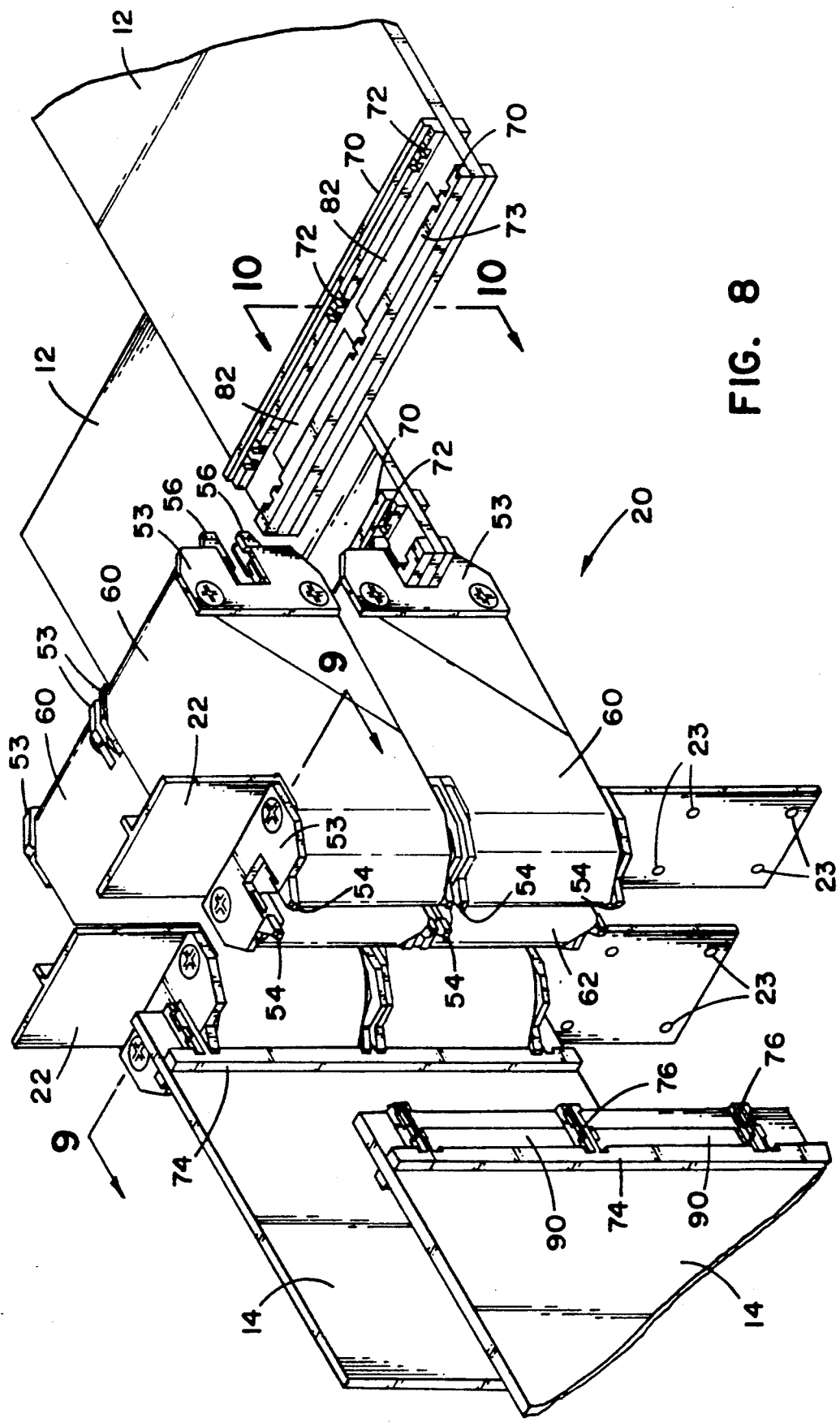
FIG. 8 is a perspective view of four orthogonal interconnect modules in the process of attachment to common memory module boards and central processing boards.
Figure 9:
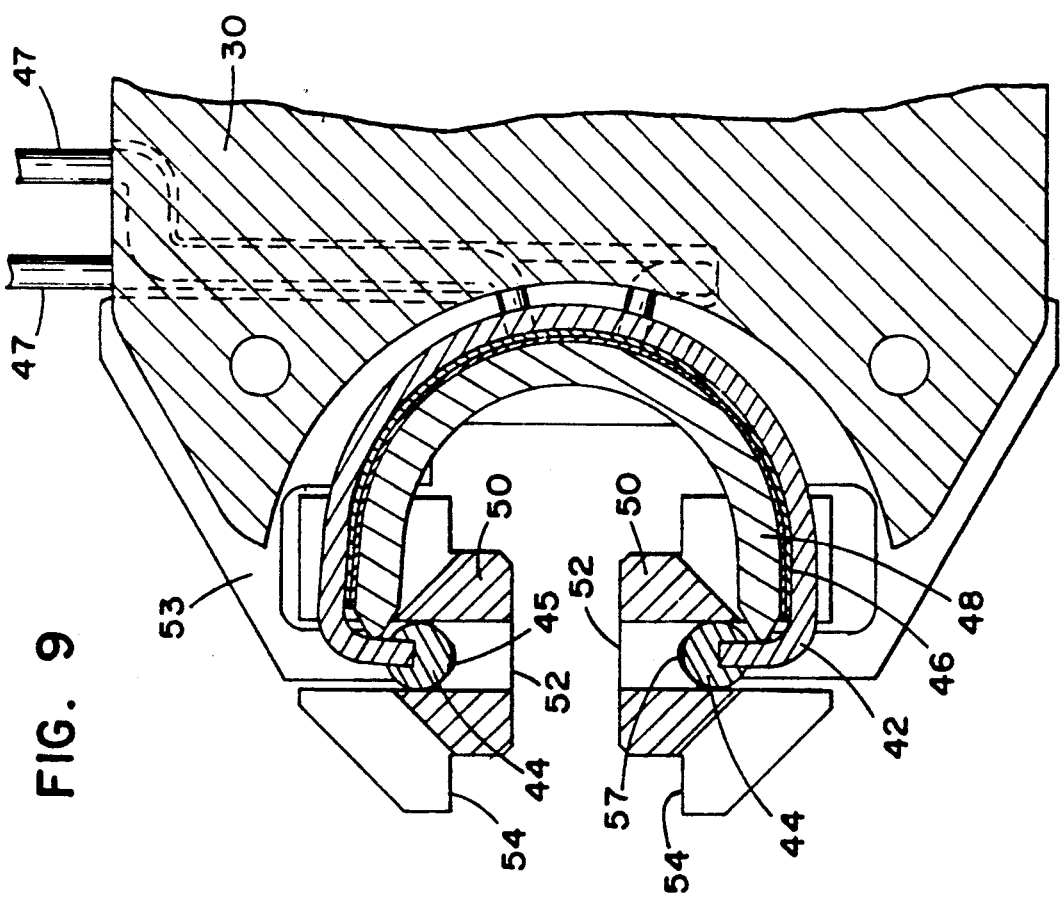
FIG. 9 is a cross-section of one end of an orthogonal interconnect module.

Referring to FIGS. 7-9, the preferred embodiment of the orthogonal interconnect module (OIM) 20 consists of a connector body with openings 40 disposed on either end but lying in orthogonal planes. The preferred OIM has a cross-section approximately 1.1" square with an overall length of approximately 2.4". The contact pressure pads 50 on both ends of the preferred OIM are located approximately 2.05" apart, center to center.

In the preferred embodiment, the body of the OIM is formed of a cap 32 and head piece 30, both preferably of non-glass filled polyetheretherketone (PEEK), which are formed to nest together. In an alternate preferred embodiment, the cap 32 and head piece 30 could be formed of a liquid crystal polymer (LCP). A T-shaped slot 33 to receive the T-shaped channel 22 is formed at the junction of the cap 30 and head piece 32. That slot 33 allows the modules 20 to be located on the T-shaped rails 22 within the computer assembly 10.

The head piece 30 preferably contains two bores 38 formed in it, each of which contain a coil spring 36 and ball bearing 34. When the cap 32 and head piece 30 are assembled, the balls 34 and springs 36 are kept within the head piece 30 by the cap 32, with the balls 34 partially protruding into the T-shaped slot 33. The balls 34 are sized to cooperate with bores 23 formed in the T-shaped channel 22 to accurately locate the modules 20 along the channel 22 at predetermined locations defined by the bores 23. Alternately, the connector body could be formed of a single piece of metal or other material and located by means other than balls and springs, variations of which will be recognized by those skilled in the art.

Each opening 40 on the ends of the preferred embodiment OIM 20 contains the means required to grasp either a CP 12 or CMM board 14. In the preferred embodiment, the springs 42,48; contact pressure pads 50; and OIM flex cable contact bumps 66 (see FIGS. 11 & 12) cooperate to result in a normal force of a minimum of 60 grams between each flex cable contact bump 66 and associated connection pad on either the CP 12 or CMM board 14. When open, the distance between the opposing flex cable contact bumps 66 of the preferred OIM 20 is a minimum of 0.02" wider than the maximum assembled CP 12 or CMM board 14 thickness. As the basic construction of either end of the OIM 20 is similar, only one of the ends will be described in detail below.

The cross section of FIG. 9 shows heater leads 47 located in a channel 49 formed within the module body opposite the cross-section line. The heater leads 47 connect the heaters 46 located in the opening with an electrical power source (not shown). In the preferred embodiment of the OIM 20, each opening 40 contains two heaters 46 although only one heater is used in normal operation, with the second heater operating as a backup to protect against failure of the first heating element. The preferred heaters 46 are of a resistance type operating on principles well-known to those in the industry and, therefore, will not be described further. The actuation cycle required to activate the memory metal spring 48 to open the OIM 20 is 2.5 amps for 15 seconds in an ambient temperature of 25 degrees Centigrade. The preferred heater 46 requires 10 watts per inch of length and reaches a temperature of 95 degrees Centigrade.

In the preferred embodiment, a connector spring 42 is nested in the circular opening of the module 20. The connector spring 42 is preferably formed primarily of a beryllium copper alloy which is chosen for its spring characteristics. Two ends of the connector spring have a rounded edge bar 44 soldered or otherwise attached to the connector spring 42. The rounded edge bars 44 are formed of brass in the preferred embodiment.

In the preferred embodiment, the contact pressure pads 50 have grooves 45 in which the rounded edge bars 44 of the connector spring 42 ride. Each contact pressure pad 50 is preferably formed of stainless steel and the groove 45 is preferably finished to prevent the bars 44 from binding in the groove 45. In the preferred embodiment, the grooves are peened to prevent binding. Also as shown in FIG. 9, the grooves 45 are also chamfered 57 to provide uniform pressure across the contact pressure pad 50 face 52. The chamfers 57 are preferably formed at a 45° angle to the face 52. In the preferred embodiment, the faces 52 of the contact pressure pads 50 are polished to a grade 16 finish to provide substantially uniform pressure over their faces 52.

Nested within the connector spring 42 of the preferred embodiment are heaters 46 and a memory metal spring 48 used to force the connector spring 42 open, thereby moving the contact pressure pads 50 apart. When heated by the heaters 46, the memory metal spring 48 attempts to straighten or flatten itself out which tends to open the connector spring 42.

The memory metal spring 48 used in the OIM's 20 of the preferred embodiment is given a flattened shape in the austenitic phase above the forming temperature. The memory metal spring 48 is formed into a curled shape while in the martensitic phase and is maintained in the martensitic phase below the austenitic transformation temperature when the OIM 20 is closed on a circuit board. In use, the memory metal spring 48 is curled and reforms to its flattened shape when heated to its austenitic phase. After use, as the spring 48 cools into its martensitic region, it curls into its desired semi-circular shape. The flattened shape can again be recovered when the memory metal of the spring 48 is heated into its austenitic region.

When the OIM 20 of the preferred embodiment is to be opened to remove a circuit board, the heaters 46 located next to the memory metal spring 48 are activated to warm the spring above the transition temperature so that the alloy of the spring 48 enters the austenitic phase. In the austenitic phase, the memory metal spring 48 attempts to reestablish its flattened shape which opens the connector spring 42, moving the contact pressure pads 50 of the OIM 20 away from each other, thereby allowing a circuit board to be removed without damage.

After a circuit board is replaced, the heater 46 is turned off, allowing the memory metal spring 48 to cool back to its martensitic phase. While cooling, the memory metal spring 48 returns to its curled shape which allows the connector spring 42 to move the contact pressure pads 50 and associated OIM flex cable contacts 66 together and into connection with associated contacts on a circuit board.

To those skilled in the art, the unusual behavior of the memory metal spring 48 is called the shape-memory effect. Shape-memory behavior is connected with thermoelastic austenitic transformation. The preferred embodiment of the present invention uses the shape memory effect of the memory metal alloys. The use of memory metal in electronic connectors is also disclosed in U.S. Pat. No. 4,621,882 to Krumme, issued on Nov. 11, 1989, which is incorporated herein by reference.

The memory metal used for the spring 48 in the preferred embodiment of the present invention is a nickel-titanium alloy which is sometimes referred to as Nitinol. Although in the preferred embodiment of the present invention, Nitinol alloys are described as the best mode of practicing the invention, those skilled in the art will also readily recognize that a wide variety of shape memory metals having super-elastic qualities could be substituted therefor. Shape memory behavior is found in a variety of alloys such as Ni—Ti, Ag—Zn, Au—Cd, Au—Cu—Zn, Cu—Al, Cu—Al—Ni, Cu—Au—Zn, Cu—Sn, Cu—Zn, Cu—Zn—Al, Cu—Zn—Ga, Cu—Zn—Si, Cu—Zn—Sn, Fe—Pt, In—Tl, Ni—Al, Ni—Ti, Ni—Ti—X (where X is a ternary element), Ti—Co—Ni, Ti—Cu—Ni and others. In the preferred embodiment, nickel-titanium (Nitinol) alloys are used with the specific composition of the alloys selected so that the transition temperature remains well below the ambient operating temperature of the electronic assembly.

To contain the connector spring 42, memory metal spring 48, heaters 46 and contact pressure pads 50 within the opening 40 of the OIM 20, the assembly includes keeper plates 53 attached to each side of the opening. The plates 53, preferably stainless steel, are shaped to contain the springs 42,48 and contact pressure pads 50 in the proper relationship to the opening 40 of the OIM 20.

Although a memory metal spring 48 and heater 46 assembly is shown in the preferred embodiment of the OIM 20, it will be appreciated by those skilled in the art that a number of other variations could be used to open and close the contact pressure pads 50, including mechanical or electromechanical means.

OIM FLEX CABLE

Figure 11:
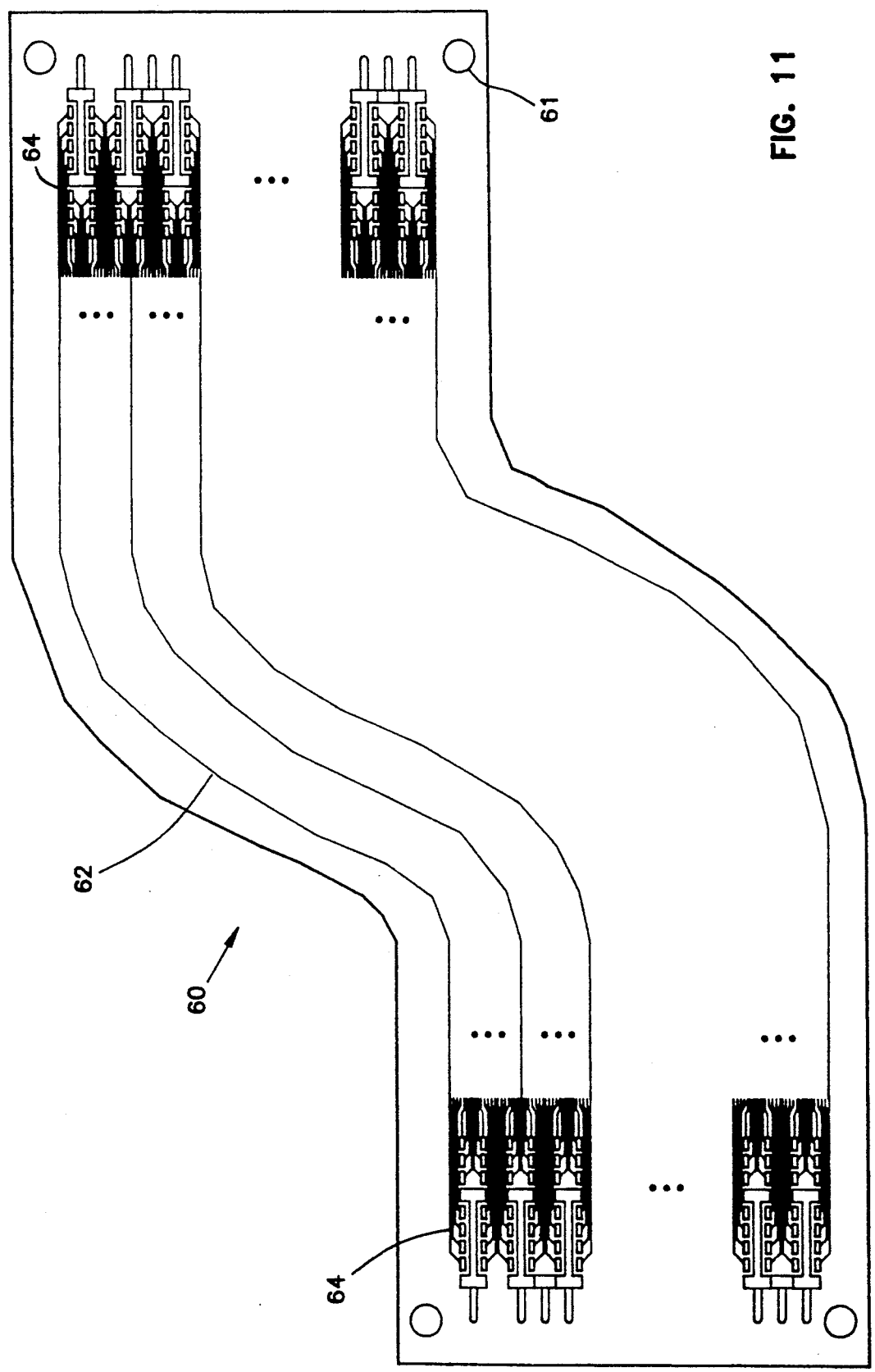
FIG. 11 is a top view of the flexible circuit used in the orthogonal interconnect module of FIGS. 7 & 8.
Figure 12:
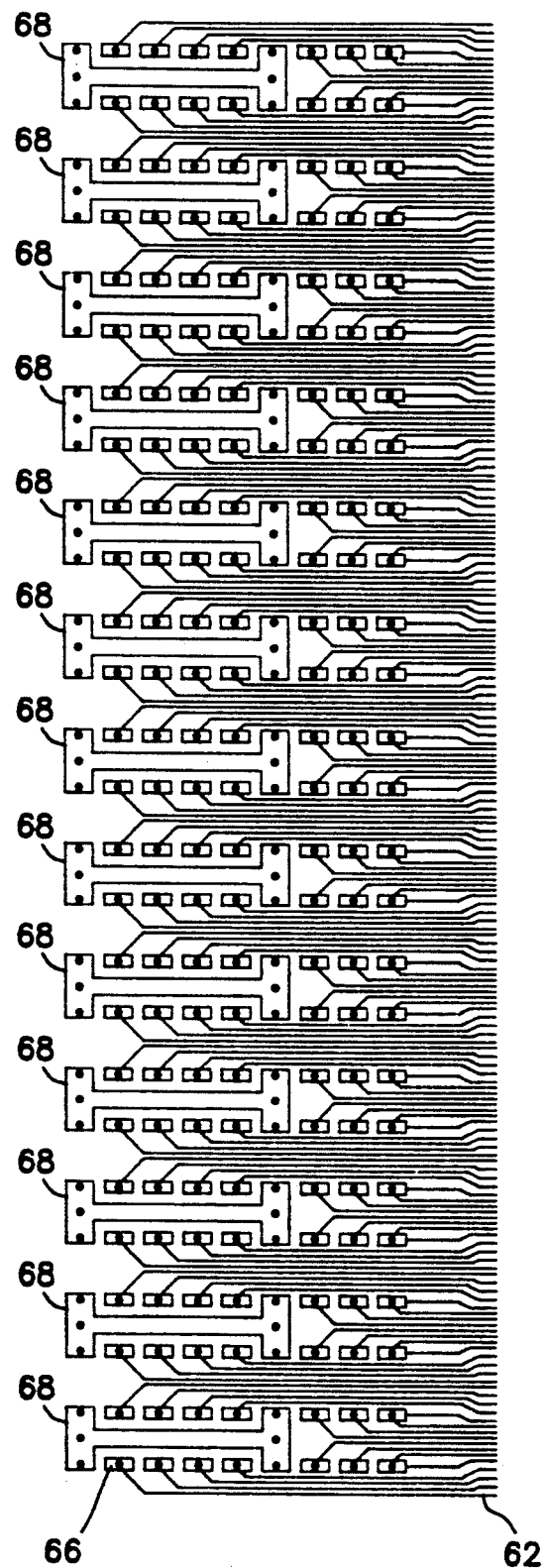
FIG. 12 is a top view of the interconnect pattern on each end of the flexible circuit of FIG. 11.

To make the electrical connections between the boards connected by the OIM 20, its preferred embodiment includes two flex cables 60 as shown in FIG. 8. The flex cables 60 are adapted to be routed along opposite sides of the connector 20. The OIM flex cable 60 as shown in FIGS. 11 & 12 is provided with registration marks 61 in order to align the contact bumps 66 of the OIM flex cable 60 on the contact pressure pad faces 52 so that accurate connections can be made with the corresponding connection pads located on either the CP 12 or CMM boards 14. After the cable 60 is attached to the contact pressure pad faces 52, the registration marks are trimmed away along with any additional excess material from the flex cables 60.

When in location, the flex cable interconnect areas 64 are located on the faces 52 of the OIM contact pressure pads 50. In the preferred embodiment, the flex cables 60 are attached to the faces 52 of the contact pressure pads 50 with an epoxy-based adhesive (not shown). The flexibility of the cable 60 allows the contact pressure pads 50 to be opened and closed as required without adversely affecting the electrical integrity of the cable 60.

The OIM flex cable 60 of the preferred embodiment is shown in FIG. 11 before attachment to the OIM 20. The flex cable 60 is preferably approximately 1.1" wide and approximately 3.3" long (as measured in a straight line from end to end). The trace lines 62 of the flex cable 60 follow the substantially rounded curves of the flex cable 60 to prevent any unwanted electrical problems due to sharp bends in the flex cable 60. The minimum trace length from one end of the preferred flex cable 60 to the other end is preferably approximately 3.65 inches with the maximum trace length being approximately 3.99 inches.

The OIM flex cable 60 preferably contains 260 trace lines across its top surface and has a bottom surface opposite the top trace layers which is essentially a continuous ground layer (not shown). The traces 62 are formed by standard photolithography methods, using either positive or negative photoresist and masks, in conjunction with electrolytic metal coating to form the traces 62, ground layer and connection bumps 66 on the flex cable 60.

In the preferred embodiment, the flex cable base is a flexible organic material (tradename: KAPTON ®) having a thickness of 0.001 inches. The traces 62 are formed of copper approximately 0.0005 inches thick with a maximum DC resistance of 1.0 ohms per inch. The traces 62 have a width of approximately 0.002 inches on centers spaced 0.004 inches apart. The ground layer is also preferably formed of copper approximately 0.0005 inches thick. The cables 60 are also preferably coated on both sides with a polyamide layer and associated adhesive which is no more than 0.001 inches thick per side, the purpose of which is to protect both the traces 62 and ground layer.

Each end of the OIM flex cable 60 contains a pattern 64 of contact bumps 66, each of which are electrically connected to the end of a trace line 62. An enlarged view of the contact bump pattern 64 is shown on FIG. 12. The contact bump pattern 64 as shown, is the same on each end of the OIM flex cable 60.

The preferred contact bump pattern 64 comprises an area approximately 1"×0.180" with the contacts 66 forming twenty-six columns and ten rows, resulting in 260 contacts 66 at each end of the flex cable 60. The columns are spaced on 0.040" centers and the rows are spaced on 0.020" centers. The contact bumps 66 of the preferred embodiment are approximately 0.0060" wide×0.010" long and extend 0.0015–0.0035 inches above each trace 62.

In the preferred embodiment, the contact bumps 66 are preferably electrolytically deposited on the ends of the flex cable traces 62 in conjunction with standard photolithography techniques using either positive or negative photoresist and the appropriate masks. The preferred bump 66 has layers including a copper base layer, copper trace layer, copper bump, nickel plate and a gold plated top layer. The contact bumps 66 are preferably planar to within ±0.0002 inches within any one of the thirteen individual contact matrices 68 (each matrix containing two columns of ten contacts 66) as shown in FIG. 12.

In the preferred system, the traces 62 are used to send electronic signals in one direction with the copper ground layer (not shown) located opposite the trace side operating as the ground for the electronic signals. An alternate embodiment of the OIM flex cable 60 can be constructed without the ground layer opposite the trace side, for systems in which pairs of traces 62 and associated contact bumps 66 are used to send and receive signals through the flex cable 60. Emitter Coupled Logic (ECL) and other similar uses requiring such paired signals will be known to those skilled in the art and will not be described further herein.

Although the traces 62, ground plane and contact bumps 66 of the preferred embodiment are formed of copper, nickel and gold, those skilled in the art will understand that other conductive materials could be used as well. Additionally, although the metals are electrolytically deposited on the flex cable 60, it will be readily understood by those in the art that metals or other conductive materials could be formed on the flex cable 60 by sputtering or a variety of other methods. Alternately, the electrically conductive patterns could be etched from a single layer of material rather than deposited on the flex cable 60 in layers.

OIM ALIGNMENT MECHANISM

The contact pressure pads 50 of the preferred OIM 20 also have alignment feet 54,56. The feet 54,56 are constructed to cooperate with slots 72,76 in alignment rails 70,74 on the CP 12 and CMM boards 14 to accurately align the dense contact bump patterns 64 on the flex cables 60 with the corresponding pads 82,90 on the CP 12 or CMM boards 14.

The alignment feet 54,56 located on the contact pressure pads 50 of the OIM 20, are of two basic designs. The alignment feet 56 required on the contact pressure pads 50 which cooperate with the preferred CP board rails 70 are adapted to allow the CP boards 12 to slide across a row of OIM's 20, as shown in FIG. 8 and will be described first.

Figure 10:
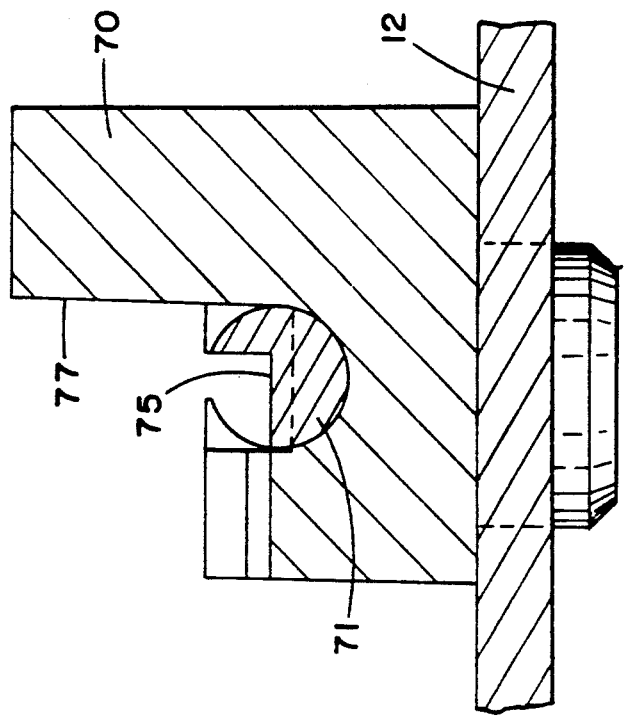
FIG. 10 is a cross-section of the rear central processing board alignment showing the lock-out mechanism in the locked out position.

In order to prevent the CP board rails 70,73 from aligning with the alignment feet 56 on the first OIM 20 in a given row of OIM's 20, the rails 70,73 include a lock out mechanism as shown in FIG. 10, which is shown in a position to allow the feet 56 to cooperate with the slots 72. The lock out mechanism comprises a mechanical assembly having a rod 71 formed with slots 75 which allow the feet 56 to cooperate with the slots 72 in the CP board alignment rail 70. The rod 71 can also be rotated within the rail 70 such that the slots 75 are facing towards the CP board 12 to prevent the alignment feet 56 from cooperating with the rail slots 72 because the slots would be filled by the rod 71 in that configuration. After the CP board 12 is in position across the row of OIM's 20, the rod 71 is rotated to expose the slots 75, allowing the alignment feet 56 to cooperate with the corresponding slots 72 in the CP board alignment rails 70,73, thus assuring proper location of the CP board pads 82 and flex cable contact bump patterns 64. The CP board alignment rail 70 located the farthest in on the CP board 12 is shown in FIG. 10 and, in addition to the lockout mechanism contained by both rails 70,73 includes a backstop 77 to prevent the CP board 12 from being pushed too far into the OIM 20.

The alignment rails 74 of the CMM boards 14 do not, however, require a lock-out mechanism like that required for the CP board alignment rails 70,73 because the CMM boards 14 are not slid across the contact pressure pads 50 of the OIM 20. The CMM board alignment feet 54 are instead designed to allow the CMM boards 14 to be slid into the opening 40 and contact pressure pads 50 along a longitudinal axis running through the length of the OIM 20, as shown in FIG. 8. As such, the preferred CMM rails 74 provide slots into which each OIM 20 slides in order to align the flex cable bump patterns 64 with the contact pads 90 of the CMM board 14.

It will be appreciated by those skilled in the art that a large variety of mechanisms could be used to align the OIM's 20 with either the CP boards 12 or the CMM boards 14 and the details described above for the preferred embodiment should not be construed to limit the invention beyond the claims.

CENTRAL PROCESSING BOARDS

In the preferred embodiment of the present invention, eight central processing (CP) boards 12 are stacked as shown in FIGS. 1-4. The CP boards 12 are preferably of a multi-layer circuit board construction well-known to those skilled in the art. In the preferred embodiment, the CP boards 12 have outside dimensions of approximately 6.5"×5.96" with the CMM boards 14 connected along the 6.5" sides.

Figure 13:
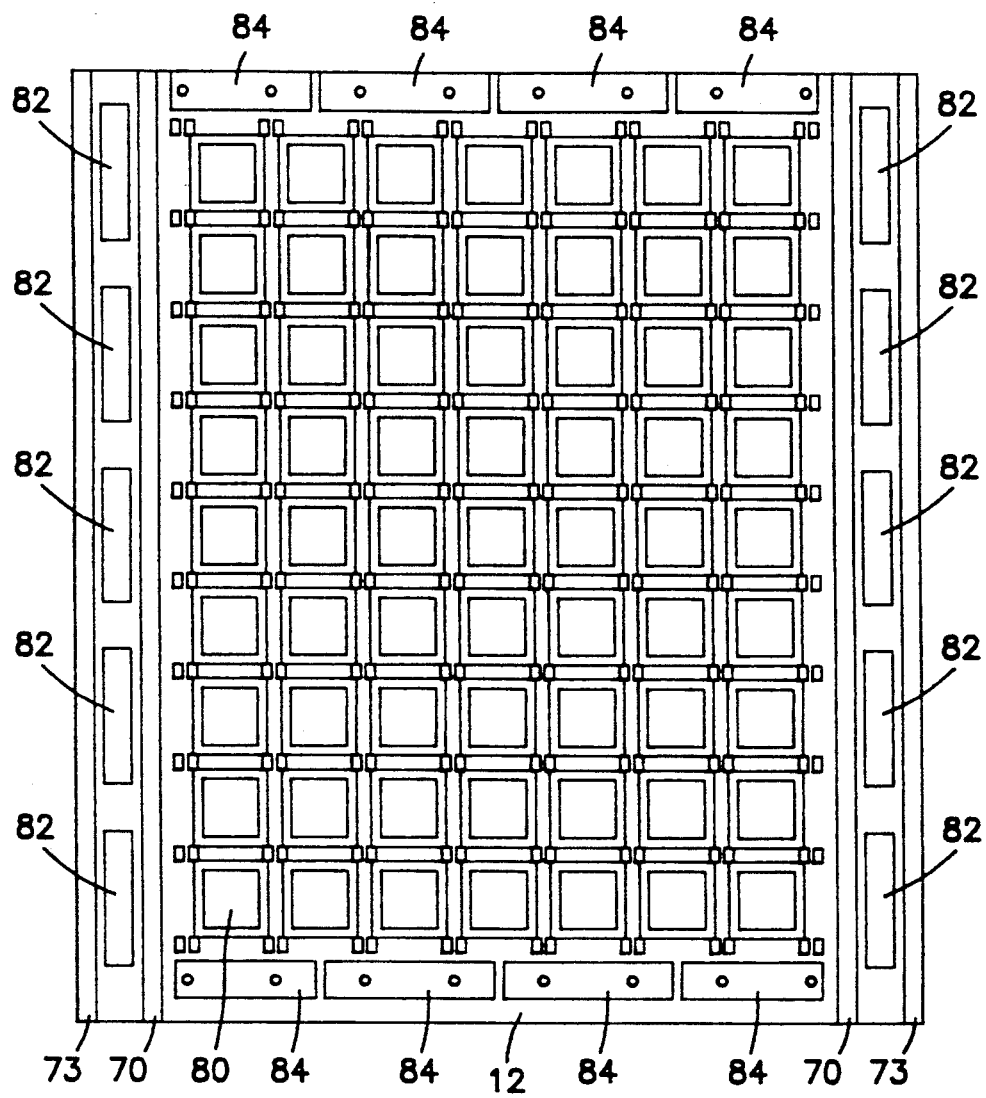
FIG. 13 is a top view of the CP board showing the alignment rails, interconnection pads, power pads, and integrated circuit chip assemblies.
Figure 14:
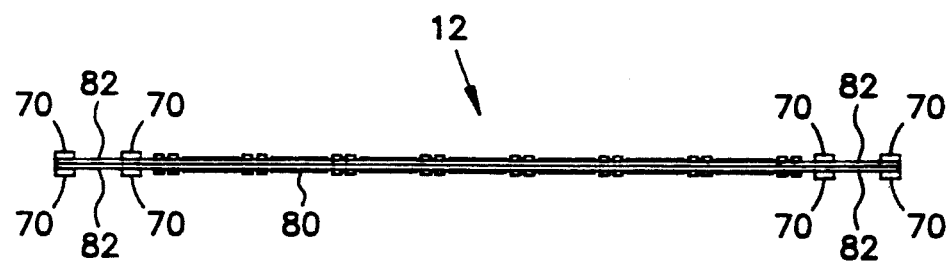
FIG. 14 is a side view of a CP board facing an edge not connected to an orthogonal interconnect module.

Referring to FIGS. 13 & 14, each CP board 12 in the preferred embodiment contains a total of twenty OIM connection pads 82 for OIM connection of the CP boards 12 to the CMM boards 14. The pads 82 are distributed such that five OIM connection pads 82 are located on each of two opposing edges on each of the two major surfaces of the CP boards. Surrounding the connection pads 82 on two sides are the pairs of CP board alignment rails 70,73, including lockout mechanisms (described above). On the remaining two opposing edges of the CP boards 12 are pads 84 on both major sides (top and bottom) for connecting power to the CP boards 12. These pads 84 could, alternately, include connections for clock distribution, Input/Output (I/O) translators, interprocessor communications or a variety of other system components.

Figure 15:
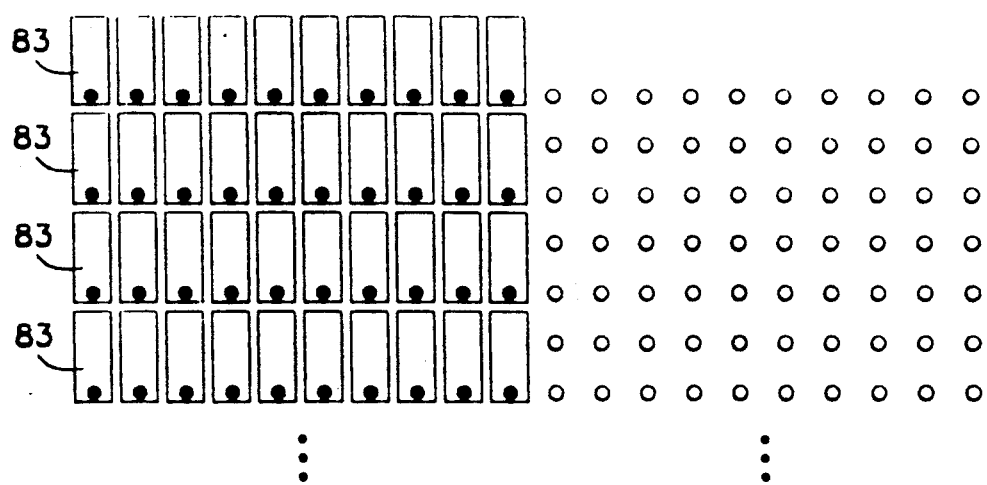
FIG. 15 is an enlarged view a portion of an orthogonal interconnect pad on either a CP or CMM board.

The OIM connection pads 82 are located on 1.2" centers along the edges of the CP board 12. As shown in FIG. 15, each pad 82 contains 260 contact pads 83 in an array having twenty-six columns of ten rows of contact pads 83 for connection to the contact bumps 66 of the flex cables 60 of the OIM's 20. Each column of pads 83 is located on 0.040" centers and each row is spaced on 0.020" centers. Each pad 83 is approximately 0.0150" wide×0.0350" long, resulting in a total OIM connection pad 82 area measuring approximately 1.0"×0.18". The OIM connection pad 82 is placed in relation to the CP board alignment rails 70,73 such that when the CP board alignment feet 56 of the OIM 20 are in alignment with the rail slots 72, the contact bumps 66 of each flex cable 60 align with the corresponding contact pads 83 of the OIM connection pad 82.

In the preferred embodiment, the CP board contact pads 83 are preferably electrolytically deposited on the CP boards 12 in conjunction with standard photolithography techniques using either positive or negative photoresist and the appropriate masks. The preferred pad 83 includes a copper base layer, nickel plate layer and a gold plated top layer.

Although the contact pads 83 of the preferred embodiment are formed of copper, nickel and gold, those skilled in the art will understand that other conductive materials could be used as well. Additionally, although the metals are electrolytically deposited on the board, it will be readily understood by those in the art that metals or other conductive materials could be formed on the CP boards by sputtering or a variety of other methods. Alternately, the electrically conductive patterns could be etched from a single layer of material rather than deposited on the CP board 12 in layers.

COMMON MEMORY MODULE BOARD ASSEMBLY

Figure 16:
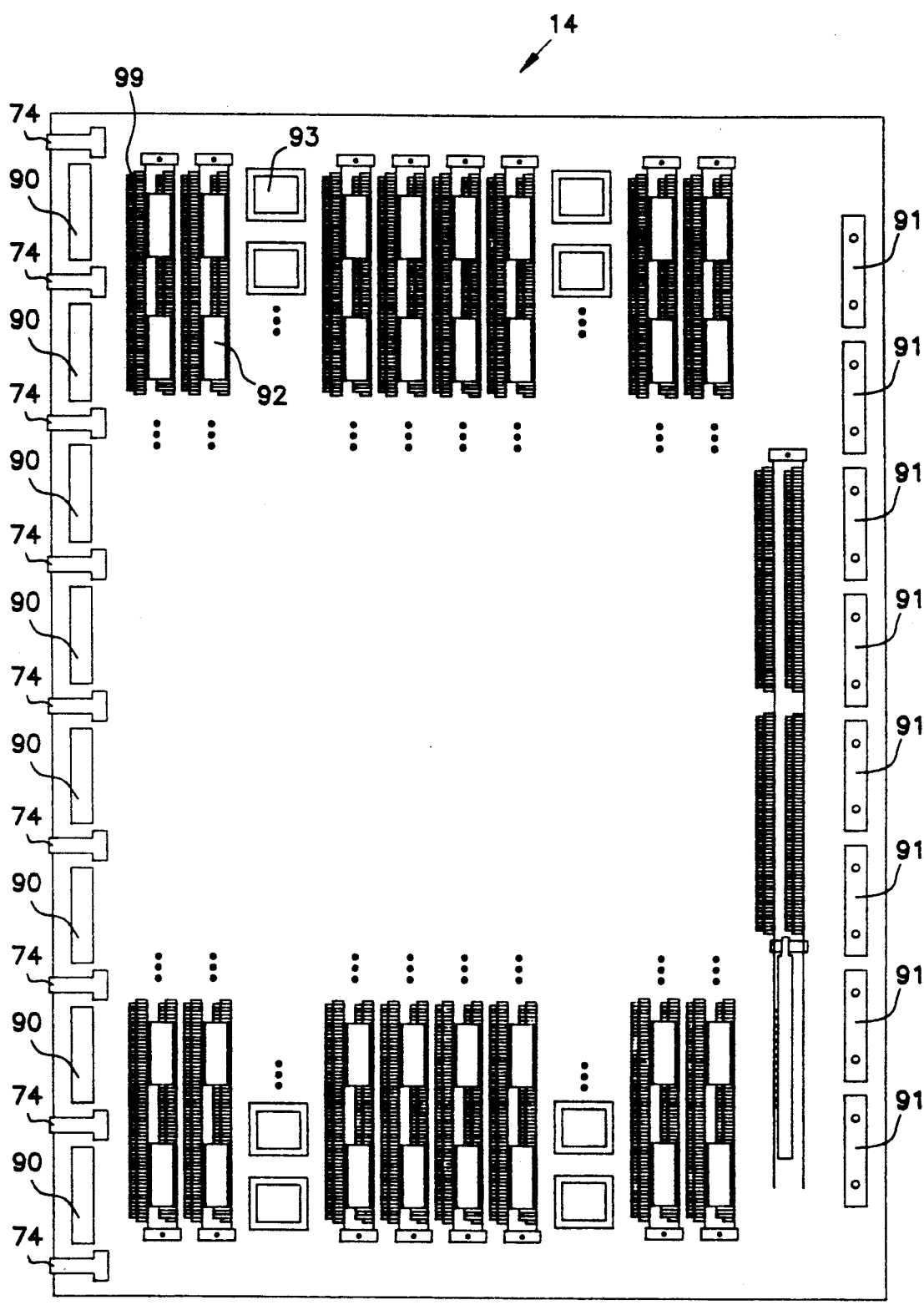
FIG. 16 is a top view of a CMM board.

A top view of a common memory module (CMM) board 14 is shown in FIG. 16. The preferred embodiment of the CMM board 14 is of a multi-layer circuit board construction well known to those skilled art. The preferred board 14 is 10"×10" and contains an 8×4 array of memory modules 99, each module 99 having two individual memory chip stacks 92 electrically connected to the OIM connection pads 90. Also located on the board are a variety of logical circuits 93, as well as other associated system components as required for operation of the CMM board.

Figure 17:
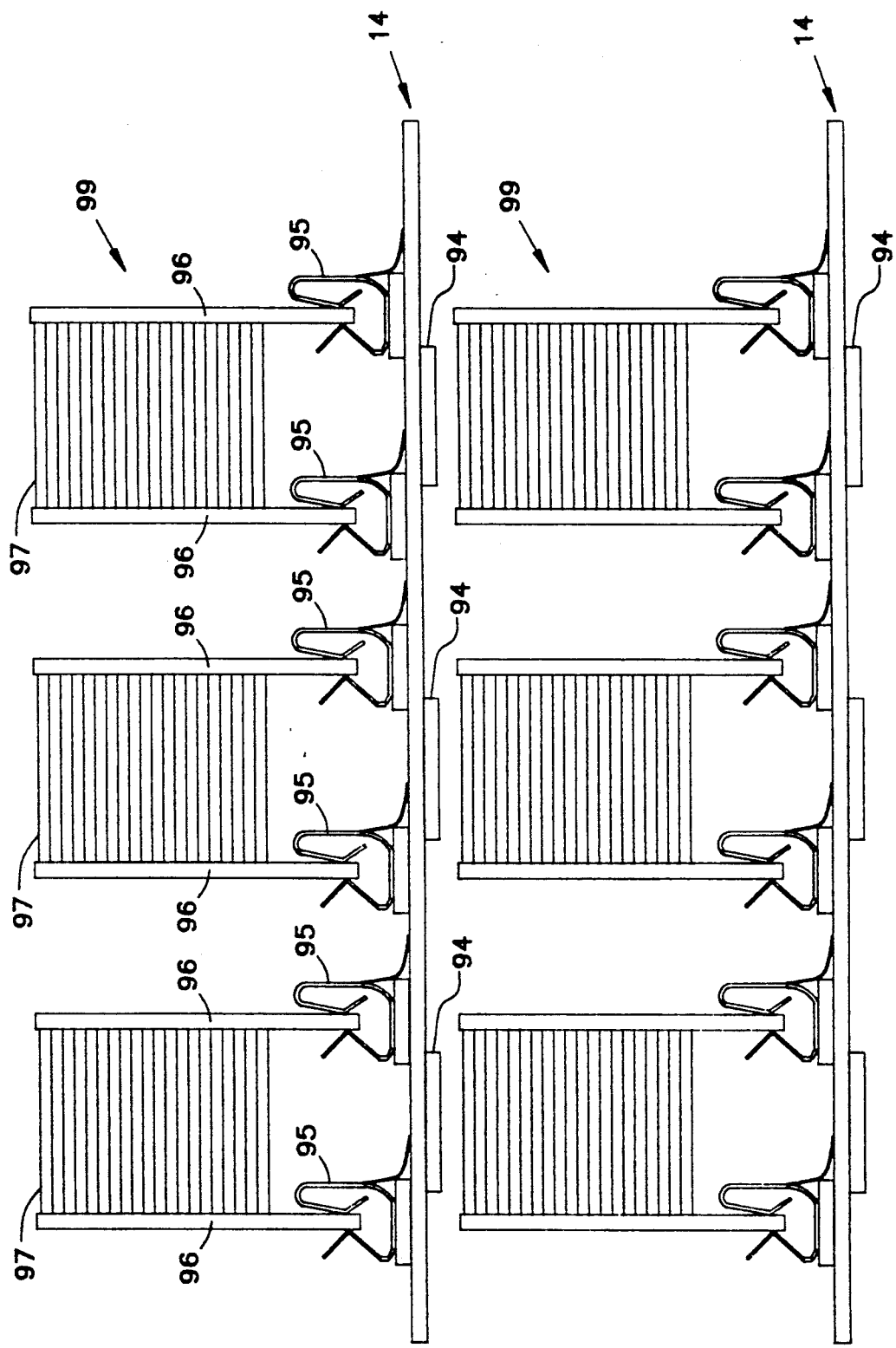
FIG. 17 is a partial end view of two CMM boards showing the memory stacks and associated memory stack connectors.

All of the memory modules 99 with chip stacks 92 are located on the same major side of the CMM board 14 as shown in FIG. 16. The logic circuits 94 used to control the flow of information into and out of each memory chip stack 92 are located on the opposite side of the boards 14 from the memory modules 99. Referring to FIG. 17, when the CMM boards 14 are located in the constructed computer assembly 10, the distance between the top of the edge boards 96 on one CMM board 14 to the bottom, logic side of the adjacent CMM board 14 is preferably approximately 0.0726 inches (nominal).

Referring to FIG. 16, one edge of the preferred CMM board 14 contains a total of sixteen OIM connection pads 90, eight on each major side of the board 14, and the CMM board alignment rails 74 required to connect with the OIM 20 to the pads 90. On the opposite edge of the CMM board 14 are connection pads 91 for power and other functions such as clock distribution, Input/Output (I/O) translators and other system components connected to the CMM board 14.

The OIM connection pads 90 of the CMM board 14, like those of the CP board, are located on 1.2" centers along the edge of the board 14. Each pad 90, shown enlarged in FIG. 15, contains 260 contact pads 83 in an array having twenty-six columns of ten rows of contact pads 83. Each column is located on 0.040" centers and each row is spaced on 0.020" centers. Each pad 83 is approximately 0.0150" wide×0.0350" long, resulting in a total OIM connection pad 90 area measuring approximately 1.0"×0.18". The OIM connection pad 90 is placed in relation to the CMM board alignment rails 74 such that when the CMM board alignment feet 54 of the OIM 20 are in alignment with the rail slots 76, the 260 contact bumps 66 of each flex cable 60 align with the corresponding 260 contact pads 83 of the CMM board OIM connection pad 90.

In the preferred embodiment, the contact pads 90 are preferably electrolytically deposited on the CMM boards 14 in conjunction with standard photolithography techniques using either positive or negative photoresist and the appropriate masks. The preferred pad 83 includes a copper base layer, nickel plate and a gold plated top layer.

Although the contact pads 83 of the preferred embodiment are formed of copper, nickel and gold, those skilled in the art will understand that other conductive materials could be used as well. Additionally, although the metals are electrolytically deposited on the board, it will be readily understood by those in the art that metals or other conductive materials could be formed on the CMM boards by sputtering or a variety of other methods. Alternately, the electrically conductive patterns could be etched from a single layer of material rather than deposited on the CMM board 14 in layers.

MEMORY STACK DETAIL

Figure 18:
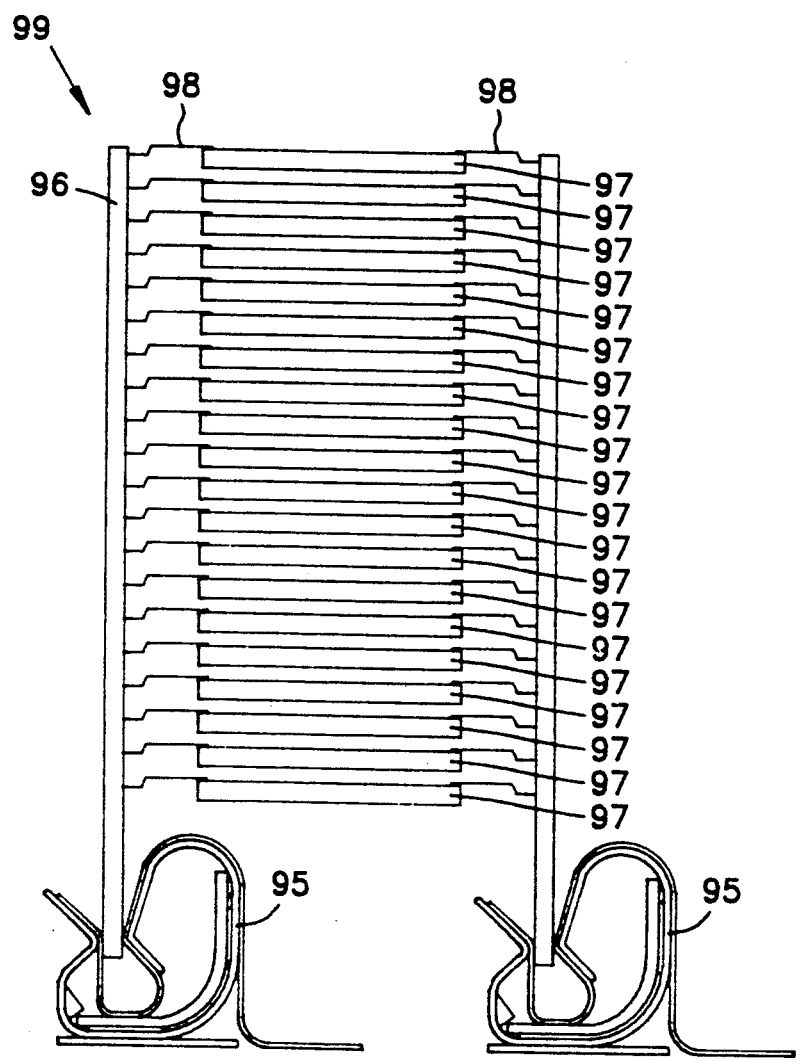
FIG. 18 is a close up view of a memory stack showing the memory chip edge boards, and memory stack connectors.

As shown in FIGS. 17 and 18, in the preferred embodiment each memory module 99 is comprised of two individual stacks 92 of twenty memory chips 97 connected to two edge boards 96. The edge boards 96 are connected to memory stack connectors (MSC) 95 located on the CMM boards 14. The memory chips 97 are connected on two sides to the edge boards 96.

Figure 19:
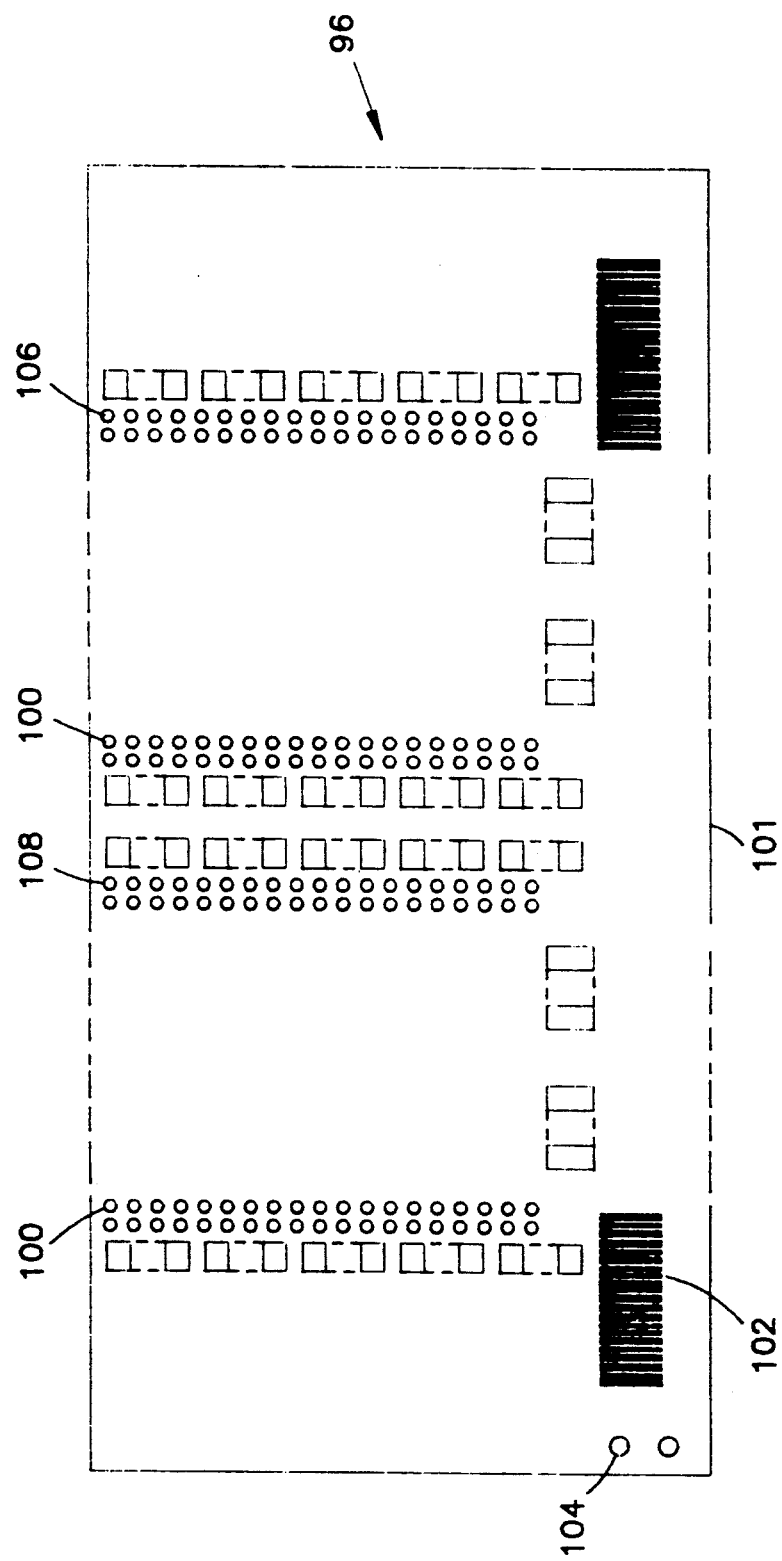
FIG. 19 is a side view of a memory stack edge board including the plated holes in the edge board as well as the trace pattern used for interconnection of the edge board with the memory stack flex connector trace pattern.
Figure 20:
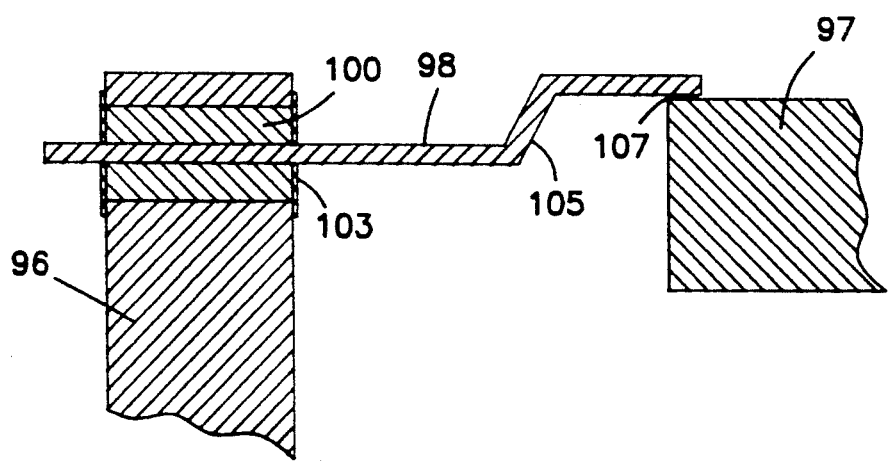
FIG. 20 is a cross section of an individual memory chip lead as attached to a CMM stack edge board.

FIG. 19 shows a side view of a preferred single edge board 96 with interconnection holes 100 and a trace pattern 102 located on the side of the board which slides into the MSC 95. The preferred edge board 96 is 2.24" long, 1.08" high and 0.03" thick. The edge board 36 includes registration holes 104 for aligning the memory stack 92 in the MSC 95. In the preferred embodiment the edge board holes 100 are located in two rectangular arrays 106,108 as shown in FIG. 19, each array 106,108 for connection to an individual stack of memory chips 97 and measuring approximately 0.54" long and 0.72" high. The holes 100 are located in nineteen columns and twenty rows. The columns are located on 0.03" centers and the rows are located on 0.04" centers. As shown in FIG. 20, each hole 100 is 0.016" in diameter and is drilled through a 0.02" diameter contact pad 103 formed on the board 96.

The preferred edge board trace pattern 102 is approximately 1.876" long and 0.09" high and is located approximately 0.05" from the bottom edge 101 of the board 96. The pattern of the traces 102 is shown having varying widths which are dependent on whether the traces are designed to carry signals or are for power/ground purposes. The edge boards 96 are constructed using standard printed circuit board technology to connect the holes 100 with the trace pattern 102. Such details are well-known to those skilled in the art and will not be discussed further herein.

The memory chips 97 are connected to the edge boards 96 by thirty-eight tab tape leads 98, nineteen on each of two sides of the chip 97, each lead 98 being connected to contact bumps 107 on the chips 97 as shown in FIG. 20. Such tab tape lead-bump connections are well-known to those skilled in the art and will not be further described herein.

The tab tape leads 98 of the preferred embodiment have a length of 0.1130" with an oblique section 105 formed therein. The preferred angle of the oblique section 105 is approximately 22 degrees from the vertical. The leads 98 are formed with oblique sections 105 to provide mechanical stability to the memory stacks 92 as well as to provide for mismatched thermal expansion between the various components. The leads 98 are connected to the edge board holes 100 using flow-through solder technology, which is well-known to those skilled in the art and will not be further described herein.

The modular construction of the memory modules 99 allows them to be removed and/or replaced on the CMM board, thus simplifying repair and decreasing downtime of the system by allowing modules 99 to be swapped for off-board repair.

MEMORY STACK CONNECTOR

In the preferred embodiment of the present invention, the memory stack connectors (MSC) 95 of the CMM boards 14 are used to provide a zero insertion force connector to connect the memory stack edge boards 96 of a memory module 99 to the CMM board 14. Each CMM board 14 preferably contains sixty-four separate MSC's 95, with two MSC's 95 required to connect each memory module 99 to the CMM board 14, as shown in FIGS. 16-18.

Figure 21:
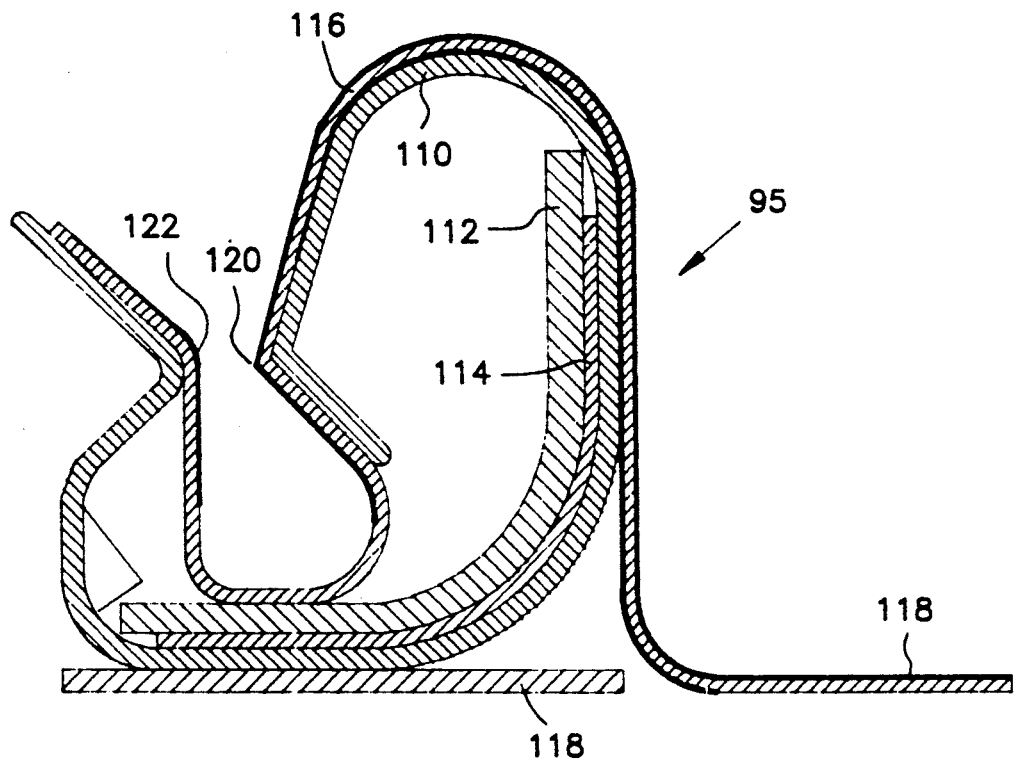
FIG. 21 is a cross section of a memory stack connector showing the trace pattern attached thereto.

The preferred MSC 95 is biased in the closed position, meaning that points 120 and 122, as shown in FIG. 21, on the MSC 95 are at their closest position to one another. Also in the preferred embodiment, each MSC 95 can be divided into two halves with one portion, containing point 122 and shown on the left in FIG. 21, being inactive and the opposite portion containing point 120 being active. The active/inactive distinction is based on the concept that during opening and closing of the MSC 95 only the active portion moves, as further described below.

The preferred MSC 95 includes a monolithic spring section 110, preferably of a beryllium copper alloy, to provide a constant spring force attempting to bias the MSC 95 in the closed position. When closed on an edge board trace pattern 102, each MSC 95 will preferably provide a normal contact force of between 60 and 125 grams per trace. Those skilled in the art will recognize that a variety of metals and other materials having sufficient spring characteristics could be substituted for the beryllium copper alloy of the preferred embodiment.

The preferred MSC 95 also includes a shape memory metal portion 112, heater 114 to activate the memory metal portion, MSC flex connector 116 and additional insulation 118 between the bottom of the MSC 95 and CMM board 14 to protect the board 14 from heat damage when the heater 114 is used, all as shown in the cross section of FIG. 21. The preferred heater 114 is of a resistance type operating on principles well-known to those in the industry and, therefore, will not be described further. The heater actuation cycle required to activate the memory metal portion 112 to open the MSC 95 is 2.5 amps for 15 seconds with an ambient temperature of 25 degrees Centigrade. The preferred heater 114 requires 10 watts per inch of length and reaches a temperature of 95 degrees Centigrade. When open, the preferred MSC 95 opens a minimum of 0.02" wider between points 120 and 122 than the maximum edge board 96 thickness.

The shape memory metal portion 112 of the preferred MSC 95 is used to open and close the MSC 95 as desired. In the preferred embodiment, the shape memory metal 95 is preferably formed of a nickel titanium alloy, or Nitinol. When heated, the memory metal portion 112 tends to flatten which in turn opens the MSC connector 95 to allow either removal or insertion of a memory module 99.

The memory metal used in the preferred MSC 95 of the present invention is given a flattened shape in the austenitic phase above the forming temperature. The memory metal is formed into a curled shape while in the martensitic phase and is maintained in the martensitic phase below the austenitic transformation temperature when the MSC 95 is closed on an edge board 96. In use, the memory metal attempts to reform to its flattened shape when heated to its austenitic phase. After use, as the memory metal cools into its martensitic region, it returns to its desired curled shape. The flattened shape can again be recovered when the memory metal is heated into its austenitic region.

When the MSC 95 of the preferred embodiment is to be opened to remove the edge boards 96 of a memory module 99, the heater 114 located next to the memory metal 112 is activated to warm the metal above the transition temperature so that the alloy enters the austenitic phase. In the austenitic phase, the memory metal 112 attempts to reestablish its flattened shape which moves point 120 away from point 122, moving the MSC flex connector 116 away from the edge boards 96, thereby allowing the memory module 99 to be removed without damage.

After the memory module 99 and its associated edge boards 96 are replaced, the heater 114 is turned off, allowing the memory metal 112 to cool back to its martensitic phase. While cooling, the memory metal 112 returns to its curled shape which allows the monolithic spring section 110 to move the MSC flex connector 116 into connection with the associated trace pattern 102 on the edge board 96.

To those skilled in the art, the unusual behavior of the memory metal portion 112 of the MSC 95 is called the shape-memory effect. Shape-memory behavior is connected with thermoelastic austenitic transformation. The preferred embodiment of the present invention uses the shape memory effect of the memory metal alloys. The use of memory metal in electronic connectors is also disclosed in U.S. Pat. No. 4,621,882 to Krumme, issued on Nov. 11, 1989, which is incorporated herein by reference.

The memory metal used in the preferred embodiment of the MSC 95 is a nickel-titanium alloy which is sometimes referred to as Nitinol. Although in the preferred embodiment of the present invention, Nitinol alloys are described as the best mode of practicing the invention, those skilled in the art will also readily recognize that a wide variety of shape memory metals having super-elastic qualities could be substituted therefor. Shape memory behavior is found in a variety of alloys such as Ni—Ti, Ag—Zn, Au—Cd, Au—Cu—Zn, Cu—Al, Cu—Al—Ni, Cu—Au—Zn, Cu—Sn, Cu—Zn, Cu—Zn—Al, Cu—Zn—Ga, Cu—Zn—Si, Cu—Zn—Sn, Fe—Pt, In—Tl, Ni—Al, Ni—Ti, Ni—Ti—X (where X is a ternary element), Ti—Co—Ni, Ti—Cu—Ni and others. In the preferred embodiment, nickel-titanium (Nitinol) alloys are used with the specific composition of the alloys selected so that the transition temperature remains well below the ambient operating temperature of the electronic assembly.

MSC FLEX CONNECTOR

Figure 22:
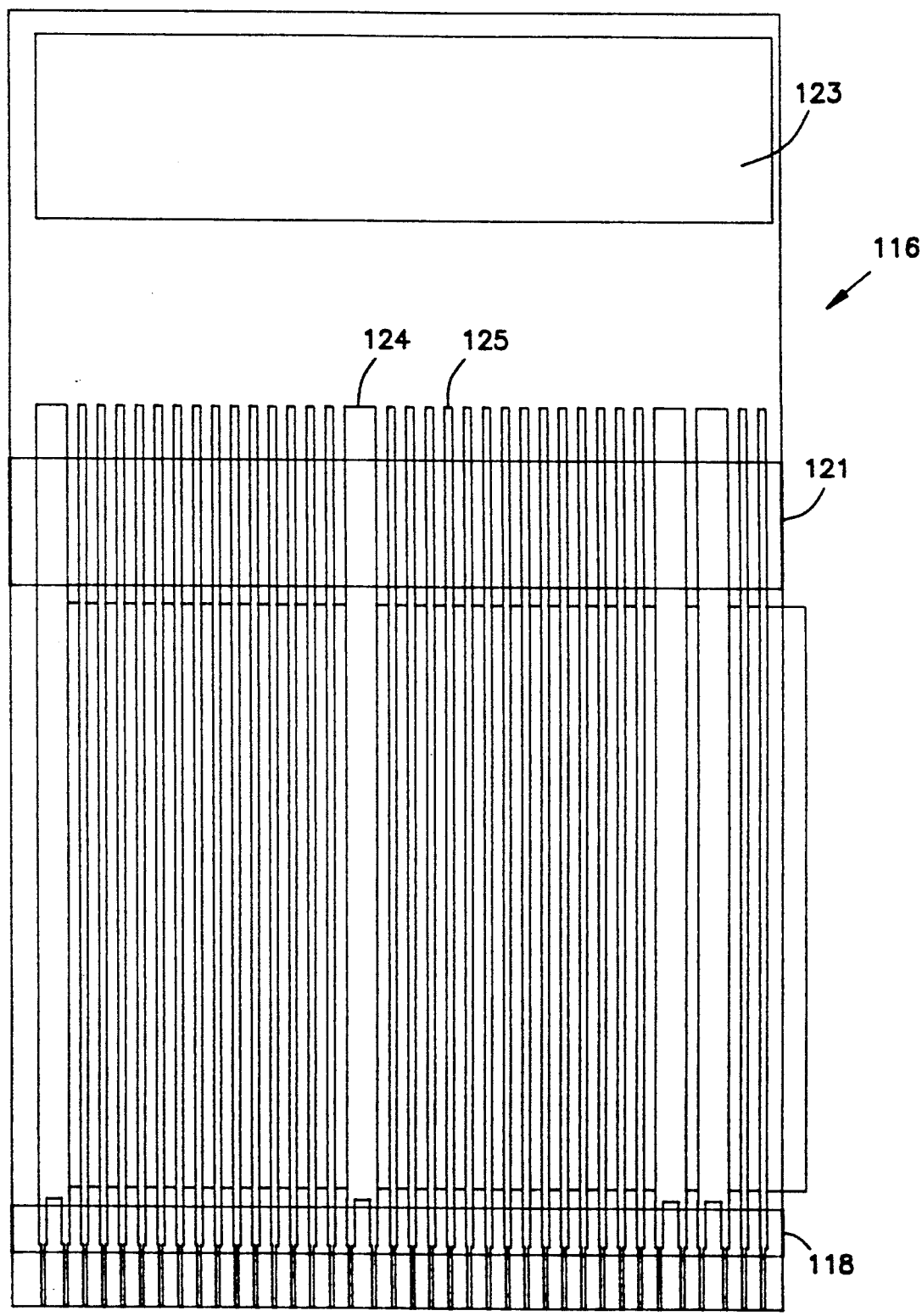
FIG. 22 is a top view of the trace pattern of the memory stack flex connector.

To make electrical connection between the trace pattern 102 on the edge boards 96 and the CMM board 14, the MSC 95 preferably has a trace pattern located on a flexible connector 116 which is connected to monolithic spring 110 of the MSC 95 as shown in FIG. 21. Referring also to FIG. 22, the trace pattern window 121 on the flex connector 116 contacts the trace pattern 102 located on the common memory stack edge boards 96 at point 120 when the edge boards 96 are inserted into a closed MSC 95.

In the preferred embodiment, the MSC flex connector 116 is attached to the MSC 95 with an epoxy-based adhesive (not shown). The flex connector 116, as shown in FIG. 22 is preferably approximately 1.93" high and 0.84" wide. A detail of the trace pattern of the preferred MSC flex connector 116 is also shown in FIG. 22. The pattern is exposed in two locations 118,121. The CMM board contact window 118 is used to connect the traces 124, 125 to the CMM board 14 and the edge board contact window 121 is used to contact the edge board trace pattern 102 when the flex connector 116 is attached to the MSC 95. In an alternate preferred embodiment of the MSC flex connector 116, a power/ground layer (not shown) can also exposed at window 123, which is attached to the inactive portion of the MSC 95 at point 122 for connection to a corresponding area on an alternate preferred embodiment of the edge boards 96.

When the flex connector 116 is attached to the MSC 95 in the preferred embodiment, the edge board contact window 121, 0.080" wide across the flex connector 116, is centered 0.120" down from the top of the MSC 95. The CMM contact window 118, preferably 0.025" wide across the flex connector 116, is approximately 0.065" from the active portion of the monolithic spring 110 of the MSC 95. The flexibility of the connector 116 allows the MSC 95 to be opened and closed for a large number of cycles without adversely affecting the integrity of the traces 124,125 contained in the flex connector 116.

The MSC flex connector 116 preferably contains signal trace lines 125, four isolated power/ground planes with three coplanar access traces 124, an edge board contact window 121, and a CMM board contact window 118 across its surface. The features are formed by standard photolithography methods, using either positive or negative photoresist and masks, in conjunction with electrostatic metal coating to form the traces 125 and power/ground layers 124.

Figure 23:
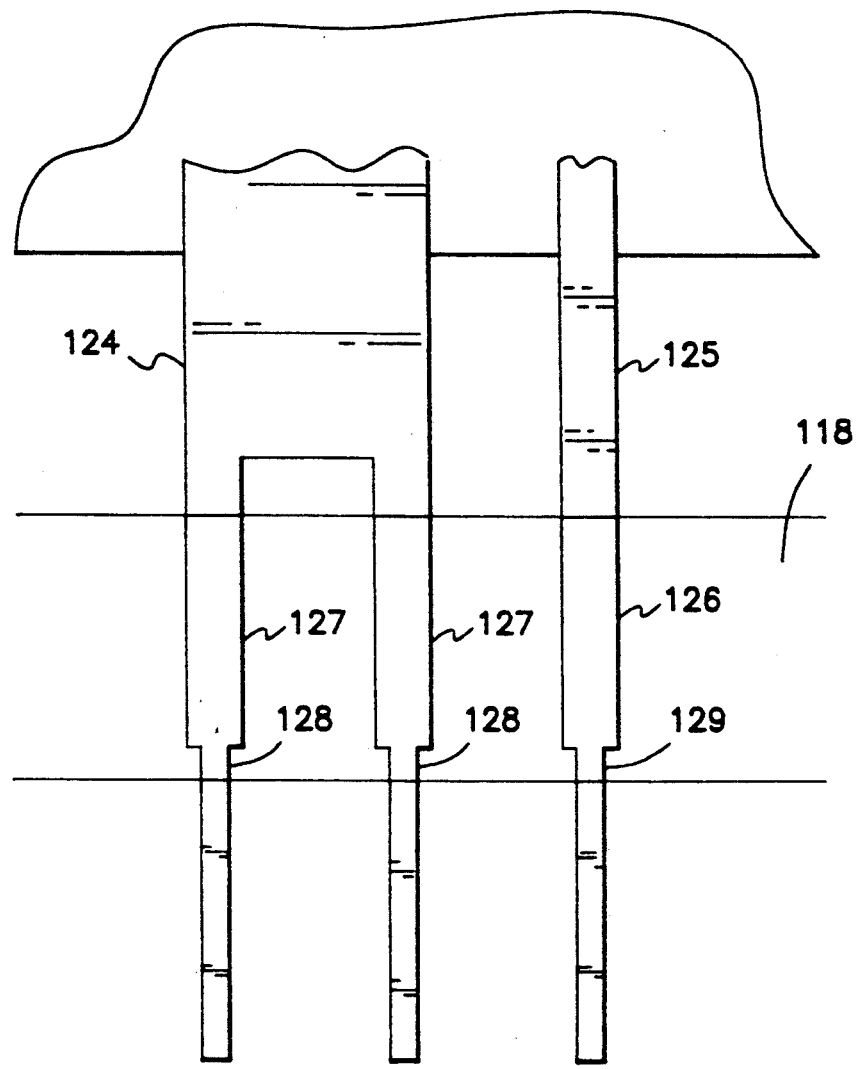
FIG. 23 is an enlarged view of the memory stack flex connector traces at the CMM board window.

In the preferred embodiment, the MSC flex connector signal 125 and power/ground metal layers 124 are formed of one ounce copper with a thickness of 0.0014". The traces 124,125 are formed with a space of 0.009" between them. The signal traces 125 are 0.005" wide and contain break-away portions 129 as shown in FIG. 23 which neck down to 0.002" for break away construction at the CMM board contact window 118. The power/ground traces are 0.019" wide in the flex connector 116 and narrow down to two portions 127, each 0.005" wide, each of which also contain break-away portions 128 which are 0.002" wide for break-away construction at the CMM board contact window 118. The bonding of the MSC flex connector traces 126,127 as shown in FIG. 23 to the CMM circuit board 14 is accomplished by through-hole bonding of the traces 126,127 as disclosed in copending U.S. patent application filed on Jun. 28, 1990 with Ser. No. 07/545,271, titled "Flexible Automated Bonding Apparatus for Chip Carriers and Printed Circuit Boards" which is incorporated herein by reference.

The copper used to form the signal traces 125 and power/ground traces of the preferred flex connector 116 is coated with a nickel barrier layer, 30 to 50 microinches thick, and an 80 to 120 microinch thick layer of soft gold (Knoop hardness of 60 to 90). The nickel layer is added as a barrier to prevent migration of the gold layer into the copper while the gold layer aids in making electrical connections while being less subject to corrosion than copper. Between the signal and power/ground layers, the preferred embodiment of the flex connector 116 includes a 0.003" layer of adhesive and a flexible organic material, with a tradename of KAPTON ®. In addition, a 0.002" layer of adhesive and KAPTON ® covers both the signal and power/ground layers except where exposed at the edge board 121 and CMM board contact windows 118.

Although the signal and power/ground layers of the preferred embodiment of the MSC flex connector 116 are formed of copper, nickel and gold, those skilled in the art will understand that other conductive materials could be used as well. Additionally, although the metals are electrolytically deposited on the flex connector 116, it will be readily understood by those in the art that metals or other conductive materials could be formed on the flex connector 116 by sputtering or a variety of other methods.

Although a specific embodiment has been illustrated and described herein, it will be appreciated by those of ordinary skill in the art that any arrangement which is calculated to achieve the same purpose may be substituted for the specific embodiment shown. For example, different types of electrical circuit boards, different electrical connection patterns, different metals, such as beryllium copper or memory metals such as nickel-titanium, or different barrier metals than those disclosed in the detailed description could be used. This application is intended to cover any adaptations or variations of the present invention. Therefore, it is manifestly intended that this invention be limited only by the claims and the equivalents thereof.

We claim:

1. An electrical device forming a closely spaced completely connected system, the device comprising:
    a plurality of first circuit boards in stacked relationship in first planes, each of said plurality of first circuit boards having at least one first board connection means for connecting each of said plurality of first circuit boards to a plurality of second circuit boards, each of said first board connection means disposed proximate at least one edge of each of said plurality of first circuit boards;
    said plurality of second circuit boards arrayed in second planes substantially perpendicular to said first planes of said plurality of first circuit boards, each of said plurality of second circuit boards having at least one second board connection means for connecting each of said plurality of second circuit boards to each of said plurality of first circuit boards, each of said second board connection means disposed proximate at least one edge of each of said plurality of second circuit boards; and

17 a plurality of orthogonal interconnect means for orthogonally connecting at least one of said first board connection means with at least one of said second board connection means when said first and second boards are disposed orthogonal to each other, each of said orthogonal interconnect means further comprising:

a body having first and second openings, said first opening located in a first end of said body and said second opening located in a second end of said body, said first and second openings being disposed substantially perpendicular to each other, said first and second openings further having both open and closed positions;

a first interconnect pattern located in each of said first openings and a second interconnect pattern located in each of said second openings, said first interconnect pattern being electrically connected to said second interconnect pattern, said first interconnect pattern being in electrical contact with said first board connection means when said first opening is in said closed position, said second interconnect pattern being in electrical contact with said second board connection means when said second opening is in said closed position, said first and second interconnect patterns being out of contact with said first and second board connection means when said first and second openings are in said open positions; and first opening means disposed in said first opening and second opening means disposed in said second opening, each of said first and second opening means for selectively placing said respective first and second openings in said open or closed position.

2. The device of claim 1, wherein each of said first and second board connection means further comprises a plurality of closely-spaced contact pads arranged in a two-dimensional matrix adapted to receive and transmit electronic signals.

3. The device of claim 1, wherein each of said plurality of first circuit boards further comprise first board connection means on both a top and a bottom surface of said plurality of first circuit boards.

4. The device of claim 1, wherein each of said plurality of second circuit boards further comprise second board connection means on both a top and a bottom surface of said plurality of second circuit boards.

5. The device of claim 1, wherein each of said first and second interconnect patterns further comprises a plurality of closely-spaced contact bumps arranged in a two-dimensional matrix adapted to receive and transmit electronic signals.

6. The device of claim 1, wherein each of of said first and second opening means further comprises a memory metal portion for opening said opening.

7. The device of claim 6, wherein said memory metal portion is comprised of an alloy exhibiting martensitic transformation behavior.

8. The device of claim 7, wherein said martensitic transformation behavior is temperature-induced.

9. The device of claim 6, wherein said memory metal portion is comprised of an alloy exhibiting a shape memory behavior.

10. The device of claim 7, wherein said memory metal portion is comprised of an alloy containing at least nickel and titanium.

18

11. The device of claim 7 wherein said memory metal portion is comprised of an alloy selected from the group consisting of Ag—Zn, Au—Cd, Au—Cu—Zn, Cu—Al, Cu—Al—Ni, Cu—Au—Zn, Cu—Sn, Cu—Zn, Cu—Zn—Al, Cu—Zn—Ga, Cu—Zn—Si, Cu—Zn—Sn, Fe—Pt, In—Tl, Ni—Al, Ni—Ti, Ni—Ti—X (where X is a ternary element), Ti—Co—Ni, Ti—Cu—Ni, and mixtures thereof.

12. The device of claim 1, wherein said first and second interconnect patterns in said first and second openings of said body are electrically connected by a continuously integral, substantially flexible connector attached to said first and second interconnect patterns.

13. The device of claim 1, wherein each contact bump of said plurality of closely-spaced contact bumps of said first interconnect pattern is electrically connected to a corresponding contact bump of said plurality of closely spaced contact bumps of said second interconnect pattern by a single trace line, said single trace line further comprising a plurality of trace lines connecting said first and second interconnect patterns, said plurality of trace lines being contained on a substantially flexible connector.

14. An orthogonal connector apparatus adapted for electrically connecting a first circuit board to a second circuit board, said first and second circuit boards being orthogonally arranged to each other, the apparatus comprising:

a body having first and second openings, said first opening located in a first end of said body and said second opening located in a second end of said body, said first and second openings disposed substantially perpendicular to each other, said first and second openings further having both open and closed positions;

a first interconnect pattern located in each of said first openings and a second interconnect pattern located in each of said second openings, said first interconnect pattern being electrically connected to said second interconnect pattern, said first interconnect pattern adapted for electrical contact with said first circuit board when said first opening is in said closed position, said second interconnect pattern being in electrical contact with said second circuit board when said second opening is in said closed position, said first and second interconnect patterns being out of contact with said first and second board connection means when said first and second openings are in said open positions; and first opening means disposed in said first opening and second opening means disposed in said second opening, each of said first and second opening means for selectively placing said respective first or second opening in said open or closed position.

15. The device of claim 8, further comprising heating means for heating said memory metal portion in each of said first and second openings.

16. The device of claim 14, wherein each of said first and second interconnect patterns further comprises a plurality of closely-spaced contact bumps arranged in a two-dimensional matrix adapted to receive and transmit electronic signals.

17. The device of claim 14, wherein each of said first and second opening means further comprises a memory metal portion for opening said opening.

18. The apparatus of claim 17, wherein said memory metal portion is comprised of an alloy exhibiting martensitic transformation behavior.

19. The apparatus of claim 18, wherein said martensitic transformation behavior is temperature-induced.

20. The device of claim 19, further comprising heating means for heating said memory means portion in each of said first and second openings.

21. The apparatus of claim 17, wherein said memory metal portion is comprised of an alloy exhibiting a shape memory behavior.

22. The apparatus of claim 18, wherein said memory metal portion is comprised of an alloy containing at least nickel and titanium.

23. The apparatus of claim 18, wherein said memory metal portion is comprised of an alloy selected from the group consisting of Ag—Zn, Au—Cd, Au—Cu—Zn, Cu—Al, Cu—Al—Ni, Cu—Au—Zn, Cu—Sn, Cu—Zn, Cu—Zn—Al, Cu—Zn—Ga, Cu—Zn—Si, Cu—Zn—Sn, Fe—Pt, In—Tl, Ni—Al, Ni—Ti, Ni—Ti—X (where X is a ternary element), Ti—Co—Ni, Ti—Cu—Ni, and mixtures thereof.

24. The device of claim 14, wherein said first and second interconnect patterns in said first and second openings of said body are electrically connected by a continuously integral, substantially flexible connector attached to said first and second interconnect patterns.

25. An orthogonal connector apparatus adapted for electrically connecting at least two orthogonally arranged circuit boards, the apparatus comprising:
a body having an opening at each of two ends, said openings disposed substantially perpendicular to each other and each opening further having both open and closed positions;
at least one interconnect pattern located in each of said openings and connected to a corresponding interconnect pattern in the opposite opening, each interconnect pattern adapted for contact with one of the circuit boards, wherein each of said interconnect patterns further comprises a plurality of closely-spaced contact bumps adapted to receive and transmit electronic signals, and further wherein said individual contact bumps corresponding interconnect patterns in opposite ends of said orthogonal interconnect means are electrically connected by a single trace line, the plurality of trace lines contained on a substantially flexible connector; and
opening means disposed in each of said openings for selectively opening each opening;
whereby the orthogonal interconnect apparatus places each interconnect pattern in contact with a circuit board when a board is disposed in an opening in the closed position and the apparatus also allows removal of each interconnect pattern from contact with a circuit board when an opening is in the open position, thereby allowing the board to be non-destructively removed from the apparatus.

26. An orthogonal connector apparatus adapted for electrically connecting at least two orthogonally arranged circuit boards, the apparatus comprising:
a body having an opening at each of two ends, said openings disposed substantially perpendicular to each other and each opening further having both open and closed positions;
at least one interconnect pattern located in each of said openings and connected to a corresponding interconnect pattern in the opposite opening, each interconnect pattern adapted for contact with one of the circuit boards, and further wherein each of said interconnect patterns further comprises:
a plurality of closely-spaced contact bumps adapted to receive and transmit electronic signals; and
said individual contact bumps of corresponding interconnect patterns on opposite ends of said apparatus are connected by a single trace line, the plurality of trace lines contained on a substantially flexible connector; and
opening means disposed in each of said openings for selectively opening each opening;
whereby the orthogonal interconnect apparatus places each interconnect pattern in contact with a circuit board when a board is disposed in an opening in the closed position and the apparatus also allows removal of each interconnect pattern from contact with a circuit board when an opening is in the open position, thereby allowing the board to be non-destructively removed from the apparatus.

* * * * *

UNITED STATES PATENT AND TRADEMARK OFFICE
CERTIFICATE OF CORRECTION

PATENT NO. : 5,167,511

DATED : December 1, 1992

INVENTOR(S) : Nicholas J. Krajewski et al.

It is certified that error appears in the above-identified patent and that said Letters Patent is hereby corrected as shown below:

In column 3, line 57, insert --of-- after the word "view" therefore.

In column 4, lines 3 and 5, "cross section" should read -- cross-section-- therefore.

In columns 6 and 13, lines 17 and 59 respectively, "cross section" should read -- cross-section-- therefore.

In column 4, line 20, insert --to-- after the word "connected" therefore.

In column 8, line 66, "on" should read --in-- therefore.

In column 15, line 29, insert --be-- after the word "also" therefore.

In column 17, line 55 (claim 6), delete "of" after the word "each" therefore.

UNITED STATES PATENT AND TRADEMARK OFFICE
CERTIFICATE OF CORRECTION

PATENT NO. : 5,167,511

DATED : December 1, 1992

INVENTOR(S) : Nicholas J. Krajewski, et al.

It is certified that error appears in the above-indentified patent and that said Letters Patent is hereby corrected as shown below:

Column 19, line 4, (claim 20), "means" should read--metal--.

Signed and Sealed this

Twenty-first Day of December, 1993

Attest:

BRUCE LEHMAN

Attesting Officer

Commissioner of Patents and Trademarks